United States Patent
Jacob et al.

(10) Patent No.: US 10,461,173 B1
(45) Date of Patent: Oct. 29, 2019

(54) METHODS, APPARATUS, AND MANUFACTURING SYSTEM FOR FORMING SOURCE AND DRAIN REGIONS IN A VERTICAL FIELD EFFECT TRANSISTOR

(71) Applicant: GLOBALFOUNDRIES INC., Grand Cayman (KY)

(72) Inventors: Ajey Poovannummoottil Jacob, Albany, NY (US); Xuan Anh Tran, Clifton Park, NY (US); Hui Zang, Guilderland, NY (US); Bala Haran, Watervliet, NY (US); Suryanarayana Kalaga, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/990,186

(22) Filed: May 25, 2018

(51) Int. Cl.
| | |
|---|---|
| *H01L 29/786* | (2006.01) |
| *H01L 29/78* | (2006.01) |
| *H01L 29/66* | (2006.01) |
| *H01L 29/423* | (2006.01) |
| *H01L 29/08* | (2006.01) |
| *H01L 21/8234* | (2006.01) |

(52) U.S. Cl.
CPC .......... *H01L 29/66666* (2013.01); *H01L 21/823487* (2013.01); *H01L 29/0847* (2013.01); *H01L 29/42392* (2013.01); *H01L 29/66545* (2013.01); *H01L 29/7827* (2013.01); *H01L 29/78642* (2013.01)

(58) Field of Classification Search
CPC ......... H01L 29/78642; H01L 29/66666; H01L 29/0847; H01L 29/66545; H01L 29/7827; H01L 29/42392; H01L 21/823487
See application file for complete search history.

(56) References Cited

U.S. PATENT DOCUMENTS

| | | | |
|---|---|---|---|
| 7,723,756 B2 | 5/2010 | Thomas | |
| 7,768,051 B2 | 8/2010 | Abbott | |
| 8,115,243 B2 | 2/2012 | Forbes | |
| 8,486,785 B2 | 7/2013 | Masouka et al. | |
| RE44,473 E | 9/2013 | Cho | |
| 9,368,572 B1 | 6/2016 | Cheng et al. | |
| 9,613,955 B1 * | 4/2017 | Anderson | H01L 27/0886 |
| 9,748,385 B1 * | 8/2017 | Balakrishnan | H01L 29/7839 |
| 9,793,401 B1 * | 10/2017 | Balakrishnan | H01L 29/7848 |
| 9,947,793 B1 * | 4/2018 | Xie | H01L 29/785 |
| 9,954,102 B1 * | 4/2018 | Mochizuki | H01L 29/6653 |

(Continued)

*Primary Examiner* — Zandra V Smith
*Assistant Examiner* — Jeremy J Joy
(74) *Attorney, Agent, or Firm* — Williams Morgan, P.C.

(57) ABSTRACT

A method, apparatus, and manufacturing system are disclosed herein for a vertical field effect transistor (vFET) including top and bottom source/drain regions produced in one epitaxial growth process. The vFET may contain a semiconductor substrate; a fin above the semiconductor substrate; a structure on a middle portion of each sidewall of the fin, wherein a lower portion of each sidewall of the fin adjacent the semiconductor substrate and at least a top of the fin are uncovered by the structure; a top source/drain (S/D) region on at least the top of the fin; and a bottom S/D region on the lower portion of the fin and the semiconductor substrate. The structure on each sidewall may be a gate or a dummy gate, i.e., the vFET may be formed in a gate-first or a gate-last process.

19 Claims, 26 Drawing Sheets

(56) References Cited

U.S. PATENT DOCUMENTS

| | | |
|---|---|---|
| 10,014,372 B1 * | 7/2018 | Leobandung ....... H01L 29/0676 |
| 10,069,008 B1 * | 9/2018 | Balakrishnan ...... H01L 29/7827 |
| 2009/0090947 A1 * | 4/2009 | Yoon ................. H01L 21/82385 |
| | | 257/296 |
| 2009/0207649 A1 | 8/2009 | Tang et al. |
| 2016/0093611 A1 * | 3/2016 | Cheng .................. H01L 27/088 |
| | | 257/329 |
| 2017/0141214 A1 * | 5/2017 | Zang ................ H01L 21/02554 |
| 2017/0222045 A1 * | 8/2017 | Leobandung ....... H01L 29/0847 |
| 2017/0229558 A1 * | 8/2017 | Anderson ......... H01L 29/66795 |
| 2018/0006024 A1 * | 1/2018 | Anderson ........... H01L 27/088 |
| 2018/0006118 A1 * | 1/2018 | Mallela ................ H01L 27/088 |
| 2018/0083121 A1 * | 3/2018 | Suvarna ........... H01L 29/66666 |
| 2018/0248034 A1 * | 8/2018 | Leobandung ... H01L 21/823481 |
| 2018/0269320 A1 * | 9/2018 | Chi .................... H01L 29/7827 |

* cited by examiner

US 10,461,173 B1

METHODS, APPARATUS, AND MANUFACTURING SYSTEM FOR FORMING SOURCE AND DRAIN REGIONS IN A VERTICAL FIELD EFFECT TRANSISTOR

BACKGROUND OF THE INVENTION

Field of the Invention

Generally, the present disclosure relates to the manufacture of sophisticated semiconductor devices, and, more specifically, to various methods for forming source and drain regions in a vertical FET device.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide semiconductor field effect transistors (MOSFETs or FETs) represent one significant type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by a voltage applied to the gate electrode. If a voltage that is less than a threshold voltage of the device is applied to the gate electrode, then there is substantially no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

To satisfy the ever-increasing desire for a smaller footprint for semiconductor devices, designers have turned to vertical FETs (vFETs). A vFET generally has a channel that is in a perpendicular configuration relative to the substrate surface. This channel may be termed a "fin." This is in contrast to conventional FETs that have channels that are configured along the plane of the substrate surface. The vertical configuration of vFETs allows for increased packing density since vFETs provide improved scaling limits as compared to conventional FETs.

The increased packing density possible with vFETs, however, raises attendant challenges. Forming source/drain (S/D) regions by epitaxial growth on top of fins runs the risk of merging of top portions of the S/D regions of one vFET with top portions of fins of neighboring vFETs, leading to electrical coupling between those vFETs. Such electrical coupling may lead to short circuits, thereby reducing the usefulness of the vFET. This problem may be especially pronounced at fin pitches (distances between neighboring vFET fins) of 36 nm or less. Further, generating top and bottom S/D regions by multiple processes, typically bottom first and top later, runs the risk of epitaxial overgrowth on the first-formed S/D region during the second process.

The present disclosure may address and/or at least reduce one or more of the problems identified above.

SUMMARY OF THE INVENTION

It would be desirable to form a vFET device with top and bottom S/D regions that reduce merging of top S/D regions and/or overgrowth of first-formed S/D regions.

The following presents a brief summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus, and manufacturing systems for fabricating source/drain regions in a vertical field effect transistor (vFET) device. In one embodiment, the present disclosure provides a method, including: forming a fin above a semiconductor substrate; forming a structure on a middle portion of each sidewall of the fin, whereby a lower portion of each sidewall of the fin adjacent the semiconductor substrate and at least a top of the fin are uncovered by the structure; and growing an epitaxial top source/drain (S/D) region on at least the top of the fin, and an epitaxial bottom S/D region on the lower portion of each sidewall of the fin and on the semiconductor substrate.

In one embodiment, the present disclosure provides a semiconductor device, including: a semiconductor substrate; a fin above the semiconductor substrate; a structure on a middle portion of each sidewall of the fin; wherein a lower portion of each sidewall of the fin adjacent the semiconductor substrate and at least a top of the fin are uncovered by the structure; a top source/drain (S/D) region on at least the top of the fin; and a bottom S/D region on the lower portion of the fin and the semiconductor substrate.

In one embodiment, the present disclosure provides a semiconductor device manufacturing system adapted to perform a method, such as is summarized above.

BRIEF DESCRIPTION OF THE DRAWINGS

The disclosure may be understood by reference to the following description taken in conjunction with the accompanying drawings, in which like reference numerals identify like elements, and in which.

Figure 1:
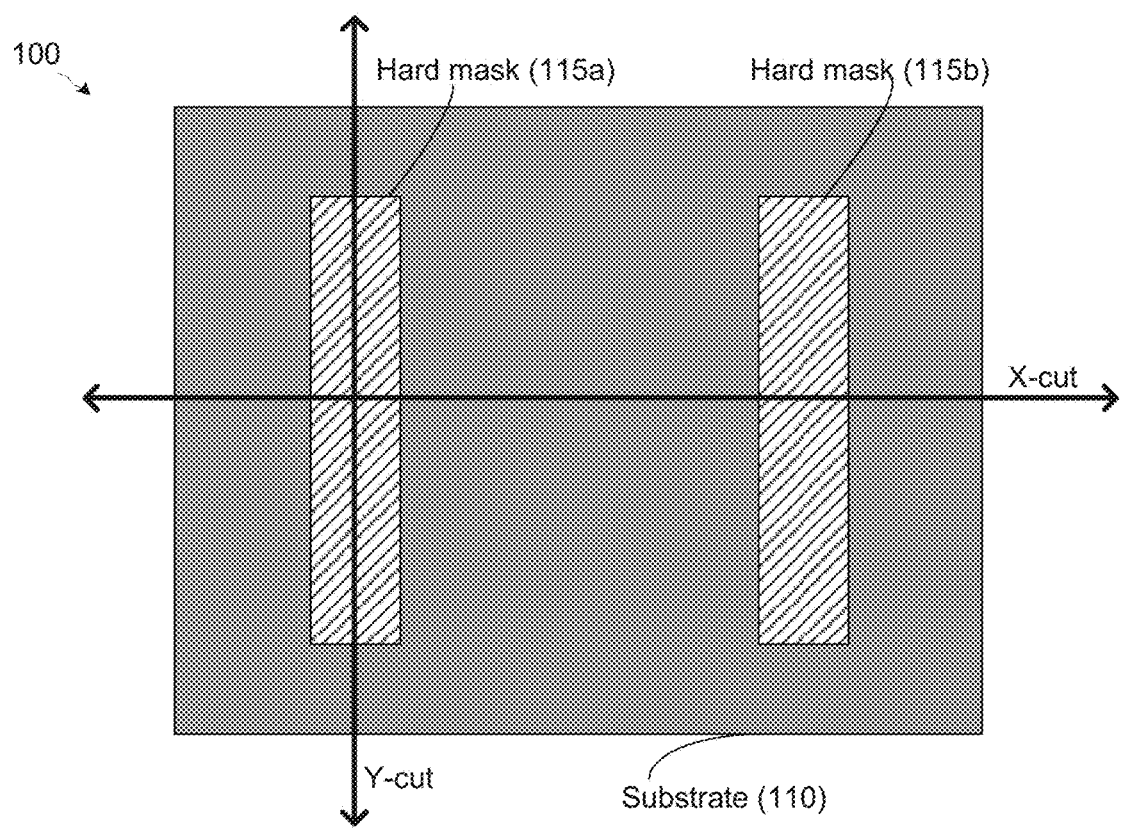
FIG. 1 illustrates a stylized plan depiction of a vFET device, showing an X cut from which one or more cross-sectional depictions in subsequent figures may be shown.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. Moreover, the stylized depictions illustrated in the drawings are not drawn to any absolute scale.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems, and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for forming vertical field effect transistor (vFET) devices with self-aligned contacts such as, for example, gate contacts. In one embodiment, a fin pitch between neighboring vFET devices may be 36 nm or less.

FIG. 1 illustrates a stylized plan depiction of a vFET device 100 prior to the performance of various processes thereon, in accordance with embodiments herein. The vFET device 100 may also be referred to as semiconductor device 100. The vFET 100 at the depicted stage of manufacture includes a plurality of fins, upon each of which hard mask 115a, 115b are disposed. Accordingly, only the hard mask 115a, 115b is visible in plan view of FIG. 1. For ease of illustration, only two hard masks 115 (and by extension, additional fins) are shown in FIG. 1; however, those skilled in the art would appreciate that the vFET device 100 may include additional fins and, accordingly, additional hard masks 115. Each fin is disposed on a substrate 110. Generally, in a final device, at least a portion of at least one side of each fin will be in contact with a gate (not shown in FIG. 1). Further, a group of one or more fins may be electrically isolated from another group of one or more fins by a shallow trench isolation (STI) feature (not shown) formed in an upper portion of the substrate 110. The locations and formation techniques for STIs can be determined and performed as a routine matter and need not be described further.

The hard masks 115a, 115b may reduce erosion of fins during processing; however, the hard masks 115a and 115b are optional. In other embodiments (not shown), the hard masks 115a and 115b may be omitted from the vFET device 100 of FIG. 1 and all subsequent figures.

The term "fin" is used for convenience herein. The same advantages arising from performing this invention with a fin-based vFET would also be expected for vFET devices containing nanosheets or nanowires in place of fins.

Subsequent stylized cross-sectional depictions of the vFET device 100 according to embodiments herein will be taken along an X-cut (through and perpendicular to the long axis of two fins 130) or a Y-cut (through and parallel to the long axis of one fin 130).

FIGS. 2-46 illustrate stylized cross-sectional depictions of a vFET device 100 under various stage of manufacture, in accordance with embodiments herein.

Figure 2:
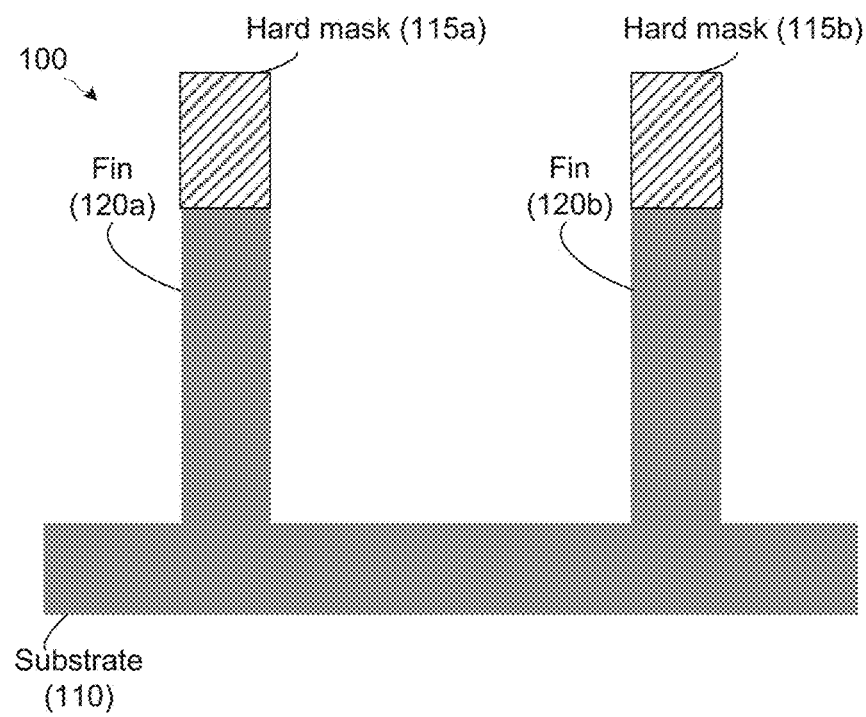
FIG. 2 illustrates a stylized X-cut cross-sectional depiction of the vFET device under manufacture with respect to a state prior to performing various processes, in accordance with embodiments herein.
Figure 3:
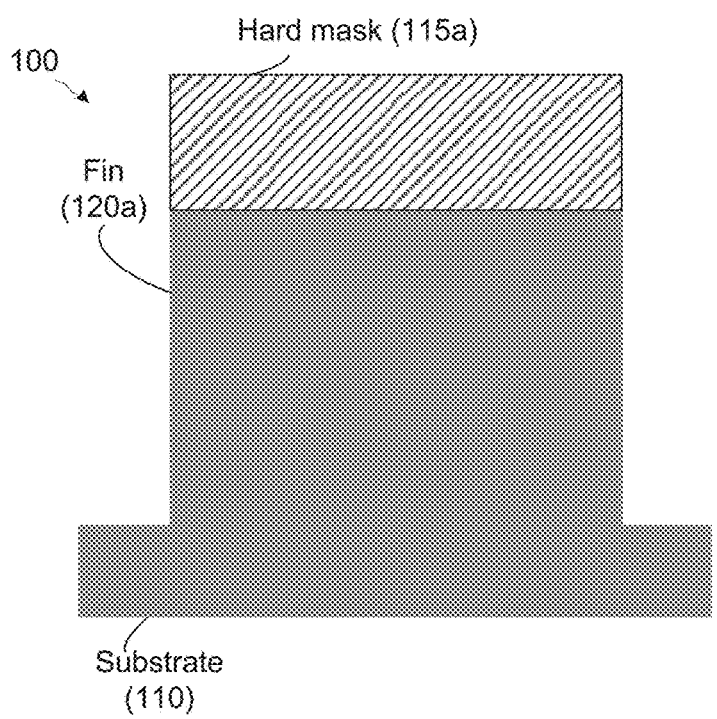
FIG. 3 illustrates a stylized Y-cut cross-sectional depiction of the vFET device under manufacture with respect to a state prior to performing various processes, in accordance with embodiments herein.

FIG. 2 illustrates a stylized X-cut cross-sectional depiction and FIG. 3 illustrates a stylized Y-cut cross-sectional depiction of the vFET device 100 shown in plan view in FIG. 1, under manufacture with respect to a state prior to performing various processes described below, in accordance with embodiments herein. FIGS. 2-3 depict fins 120a, 120b disposed on the substrate 110. The hard masks 115a, 115b are disposed on the tops of respective fins 120a, 120b.

The substrate 110 may include silicon, silicon-germanium (SiGe) having the formula $Si_xGe_{1-x}$, wherein x is in the range of 0.001 to 0.999), or a silicon-on-insulator (SOI) structure, among others. The fins 120a, 120b may include the same material as the substrate or a different material. In one embodiment, the substrate 110 may contain silicon and the fins 120a, 120b may include silicon, SiGe, and/or one or more Group III-V metals. The hard masks 115a, 115b may include silicon nitride, among other materials.

In embodiments wherein the fins 120a and 120b are components of a PFET vFET, the fins 120a and 120b may contain SiGe. In embodiments wherein the fins 120a and 120b are components of an NFET vFET, the fins 120a and 120b may include SiC or SiP. The fins 120a and 120b may further be doped with a dopant appropriate for a PFET or an NFET device.

The fins 120a, 120b may have one of a variety of desired dimension. For example, the fins 120a, 120b may have a width (taken laterally across the fin parallel to the X-cut) of about 5 nm. The fin pitch (e.g., the distance between the left side of fin 120a and the left side of fin 120b in FIG. 2) may have any desired value. For example, the fin pitch may be about 36 nm. However, these values are purely exemplary. Further, the figures are not to scale.

Figure 4:
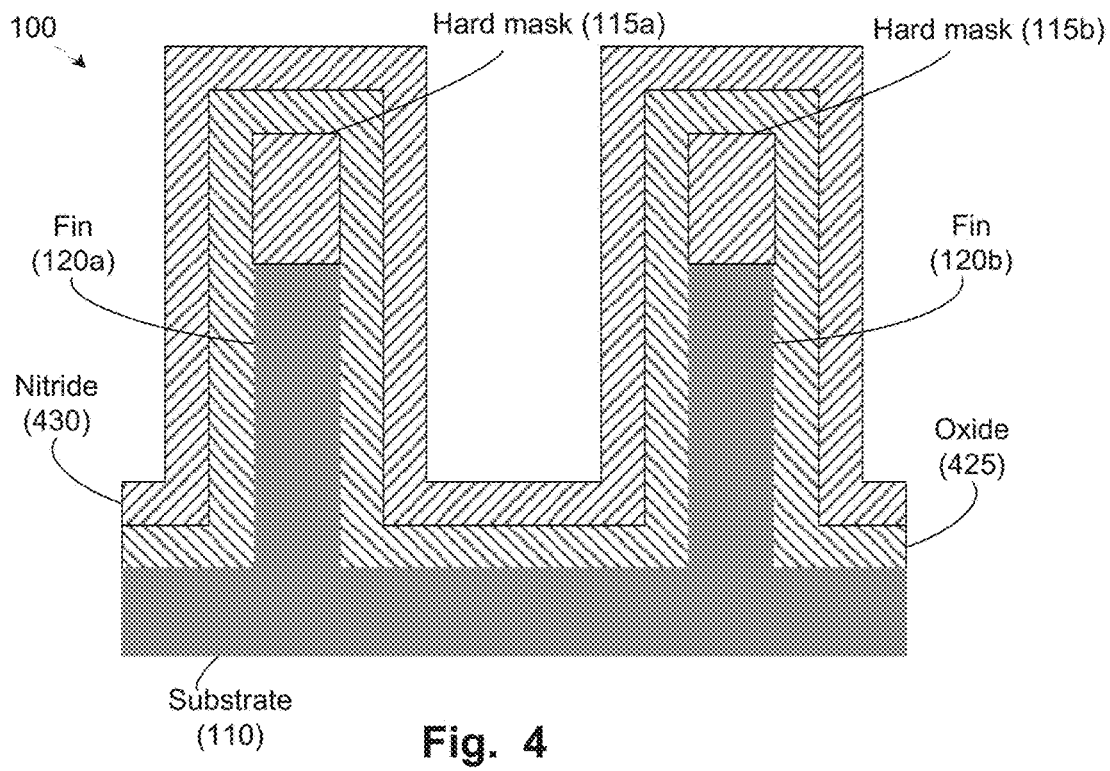
FIG. 4 illustrates a stylized X-cut cross-sectional depiction of the vFET device under manufacture with respect to oxide and nitride liner deposition processes, in accordance with embodiments herein.
Figure 5:
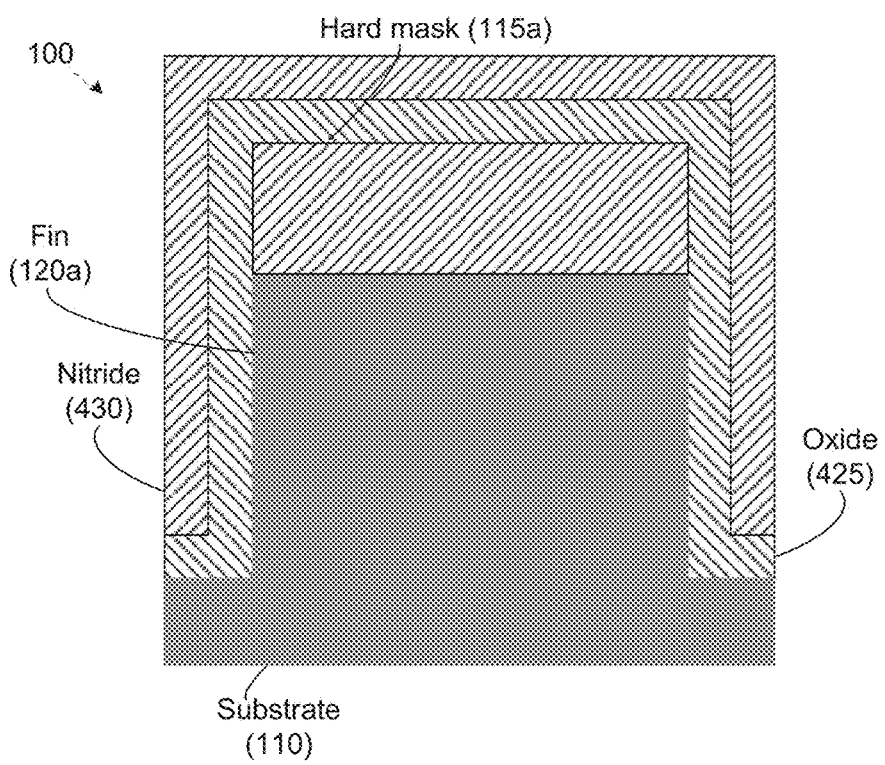
FIG. 5 illustrates a stylized Y-cut cross-sectional depiction of the vFET device under manufacture with respect to oxide and nitride liner deposition processes, in accordance with embodiments herein.

FIG. 4 illustrates a stylized X-cut cross-sectional depiction and FIG. 5 illustrates a stylized Y-cut cross-sectional depiction of the vFET device under manufacture with respect to oxide and nitride liner deposition processes, in accordance with embodiments herein. An oxide 425, such as silicon oxide, may be conformally deposited to have a substantially constant thickness on the tops of the fins 120, the sidewalls of the fins 120, and the substrate 110. In one embodiment, the oxide 425 may be deposited to a thickness of about 5 nm. Subsequently, a nitride 430, such as silicon nitride may be conformally deposited to have a substantially constant thickness on the oxide 425. In one embodiment, the nitride 430 may be deposited to a thickness of about 5 nm.

Figure 6:
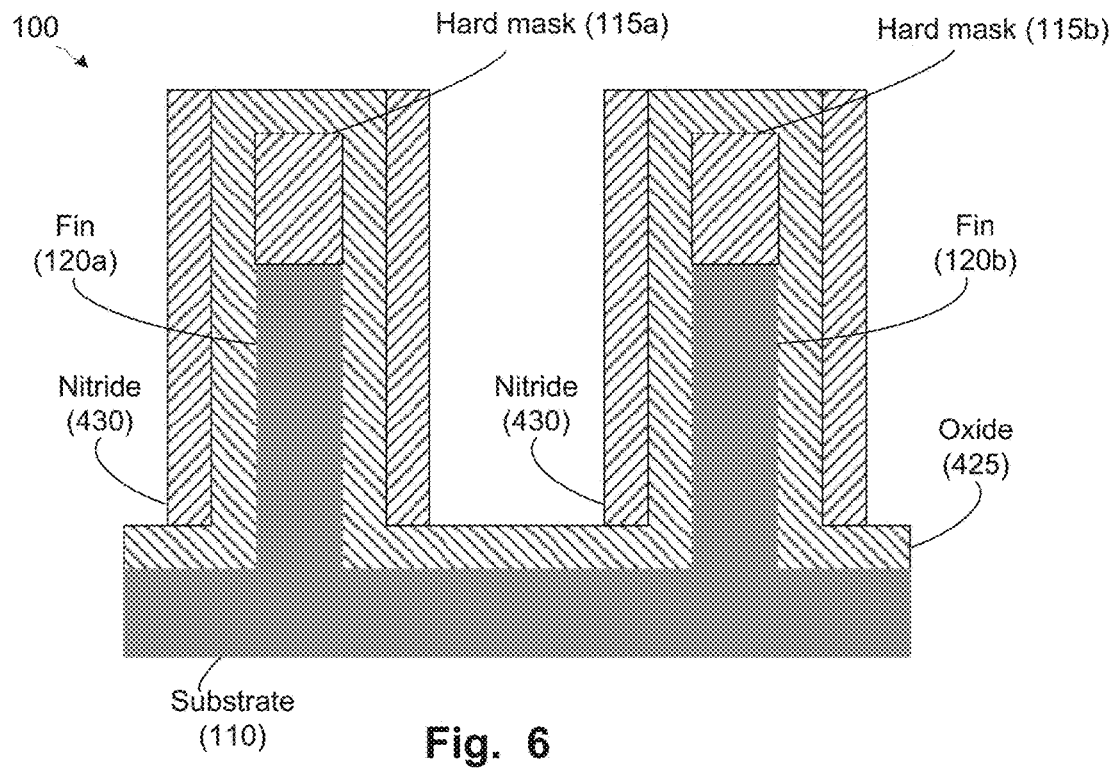
FIG. 6 illustrates a stylized X-cut cross-sectional depiction of the vFET device under manufacture with respect to a selective directional nitride recess process, in accordance with embodiments herein.
Figure 7:
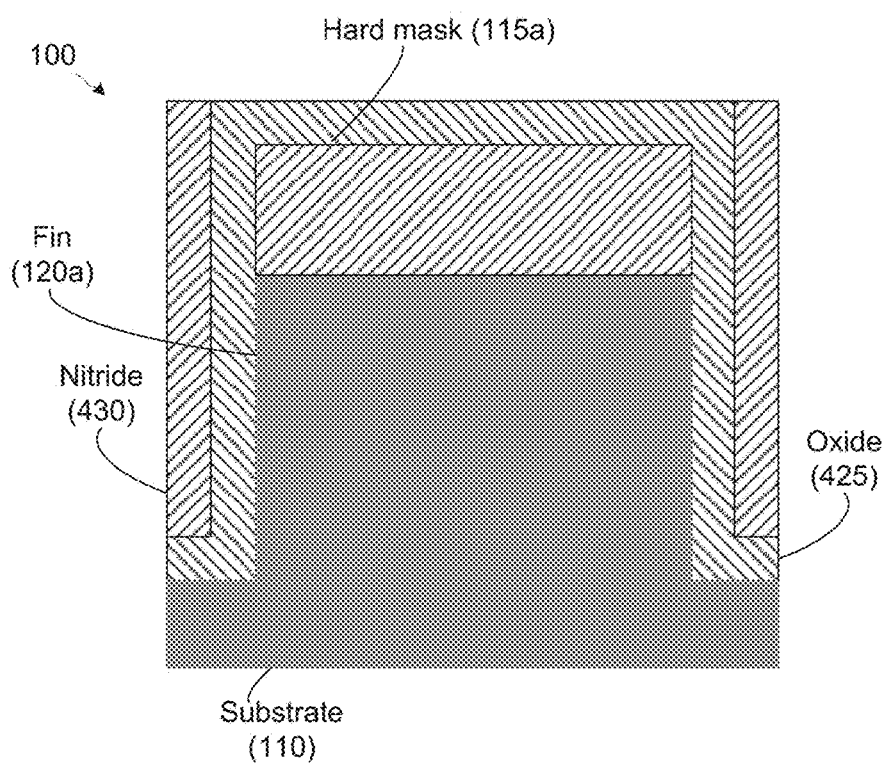
FIG. 7 illustrates a stylized Y-cut cross-sectional depiction of the vFET device under manufacture with respect to a selective directional nitride recess process, in accordance with embodiments herein.

FIG. 6 illustrates a stylized X-cut cross-sectional depiction and FIG. 7 illustrates a stylized Y-cut cross-sectional depiction of the vFET device under manufacture with respect to a selective directional nitride recess process, in accordance with embodiments herein. Portions of the nitride 430 disposed on horizontal surfaces are removed, thereby exposing oxide 425 on the substrate 110 between fins 120a and 120b, and on the tops of the fins 120a and 120b.

Figure 8:
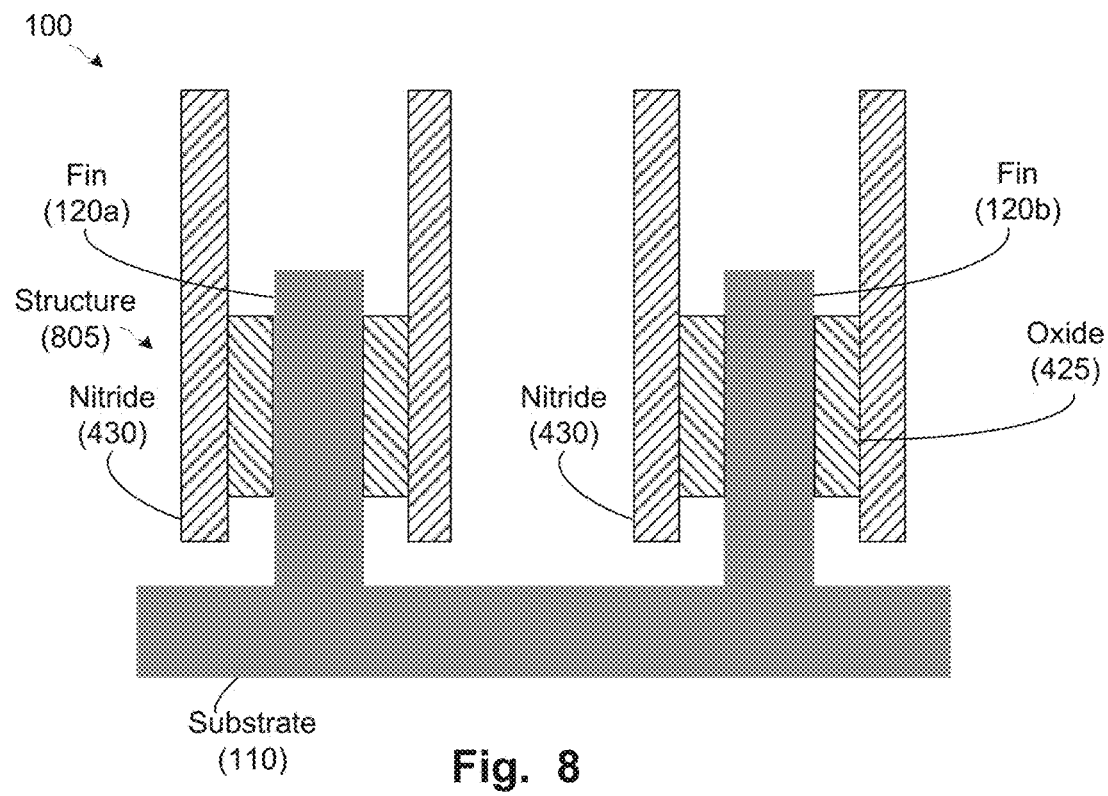
FIG. 8 illustrates a stylized X-cut cross-sectional depiction of the vFET device under manufacture with respect to oxide etch and hard mask removal processes, in accordance with embodiments herein.
Figure 9:
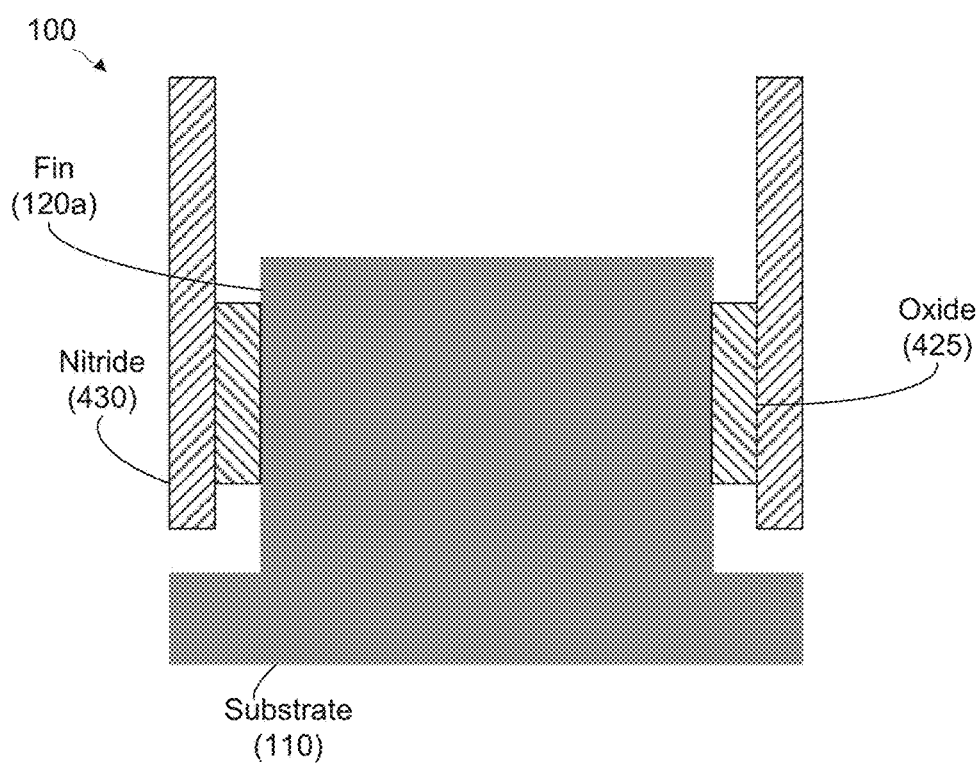
FIG. 9 illustrates a stylized Y-cut cross-sectional depiction of the vFET device under manufacture with respect to oxide etch and hard mask removal processes, in accordance with embodiments herein.

FIG. 8 illustrates a stylized X-cut cross-sectional depiction and FIG. 9 illustrates a stylized Y-cut cross-sectional depiction of the vFET device under manufacture with respect to oxide etch and hard mask removal processes, in accordance with embodiments herein. The oxide 325 may be etched, which removes horizontal portions of the oxide 425 on the substrate 110 and on the tops of the fins 120a and 120b, and etching may be continued until portions of the oxide 425 under the remaining nitride 430, along the upper portions of the sidewalls of the fins 120a and 120b, and along the lower portions of the sidewalls of the fins 120a and 120b are removed.

The hard masks 115a and 115b may be removed at this time. In embodiments wherein no hard mask 115 is disposed on a fin 120, hard mask removal would not be necessary.

The oxide etch process yields a structure 805, including the remaining oxide 425 and remaining nitride 430, disposed on at least a middle portion of each sidewall of each fin 120a, 120b. The structure 805 is not disposed on an upper portion of each sidewall and the top of each fin 120a and 120b. The structure 805 is also not disposed on a lower portion of each sidewall and the substrate 110.

The structure 805 may be referred to herein as a dummy gate. In later processes, after formation of epitaxial top and bottom source/drains, the dummy gate may be removed and replaced with a functional gate of a vFET device. Accordingly, the set of processes depicted in FIGS. 4-9 may be referred to as part of a "gate-last" process.

In summary, FIGS. 4-9 depict one set of processes for forming a structure on a middle portion of each sidewall of a fin, whereby a lower portion of each sidewall of the fin adjacent the semiconductor substrate and at least a top of the fin are uncovered by the structure. In the set of processes depicted in FIGS. 4-9, an upper portion of each sidewall of the fin is also exposed.

Turning now to FIGS. 10-23, another set of processes for forming a structure on a middle portion of each sidewall of a fin, whereby a lower portion of each sidewall of the fin adjacent the semiconductor substrate and at least a top of the fin are uncovered by the structure, are shown and will be described below.

Figure 10:
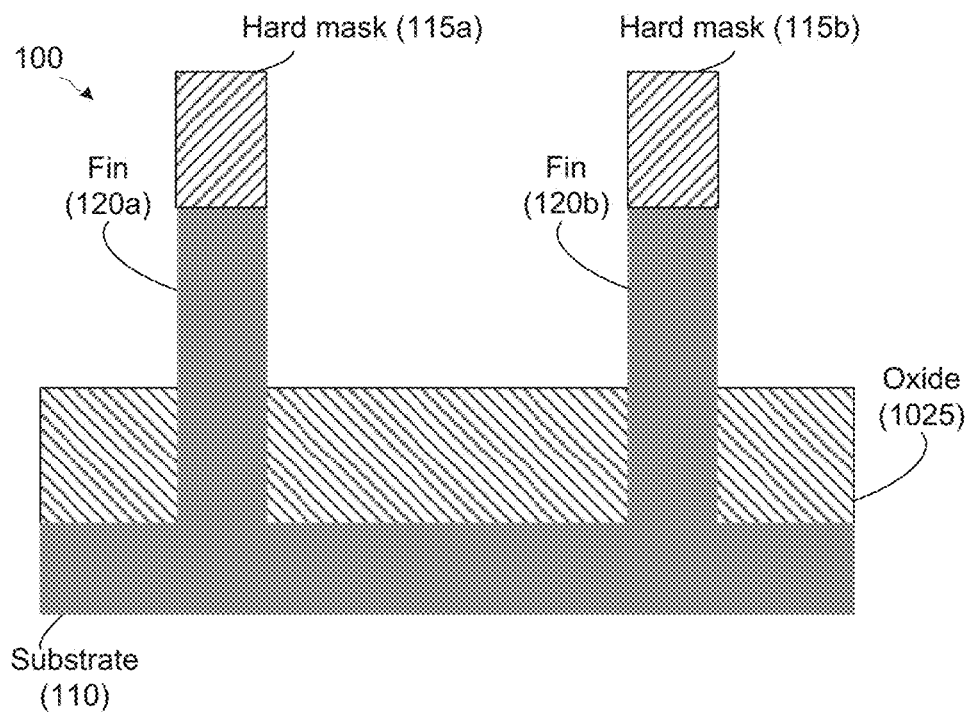
FIG. 10 illustrates a stylized X-cut cross-sectional depiction of the vFET device under manufacture of FIG. 2 with respect to oxide deposition processes, in accordance with embodiments herein.
Figure 11:
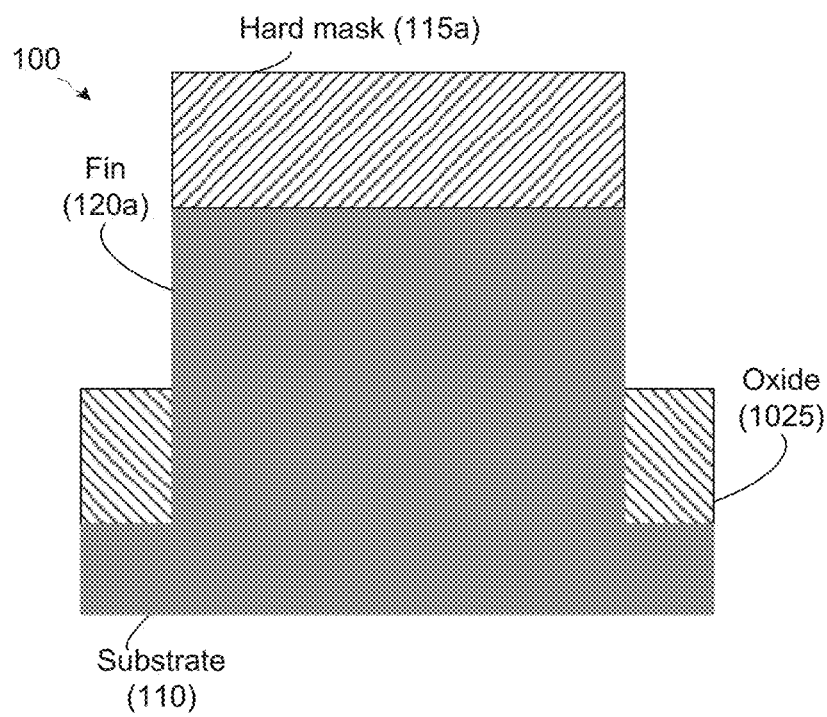
FIG. 11 illustrates a stylized Y-cut cross-sectional depiction of the vFET device under manufacture of FIG. 3 with respect to oxide deposition processes, in accordance with embodiments herein.

FIG. 10 illustrates a stylized X-cut cross-sectional depiction and FIG. 11 illustrates a stylized Y-cut cross-sectional depiction of the vFET device under manufacture of FIGS. 2-3, respectively, with respect to oxide deposition processes, in accordance with embodiments herein. An oxide 1025 is deposited over the substrate 110 between and beside fins 120a and 120b.

In embodiments wherein the vFET device 100 includes an STI to the left of fin 120a and/or to the right of fin 120b (not shown), the STI may be formed after formation of the oxide 1025.

Figure 12:
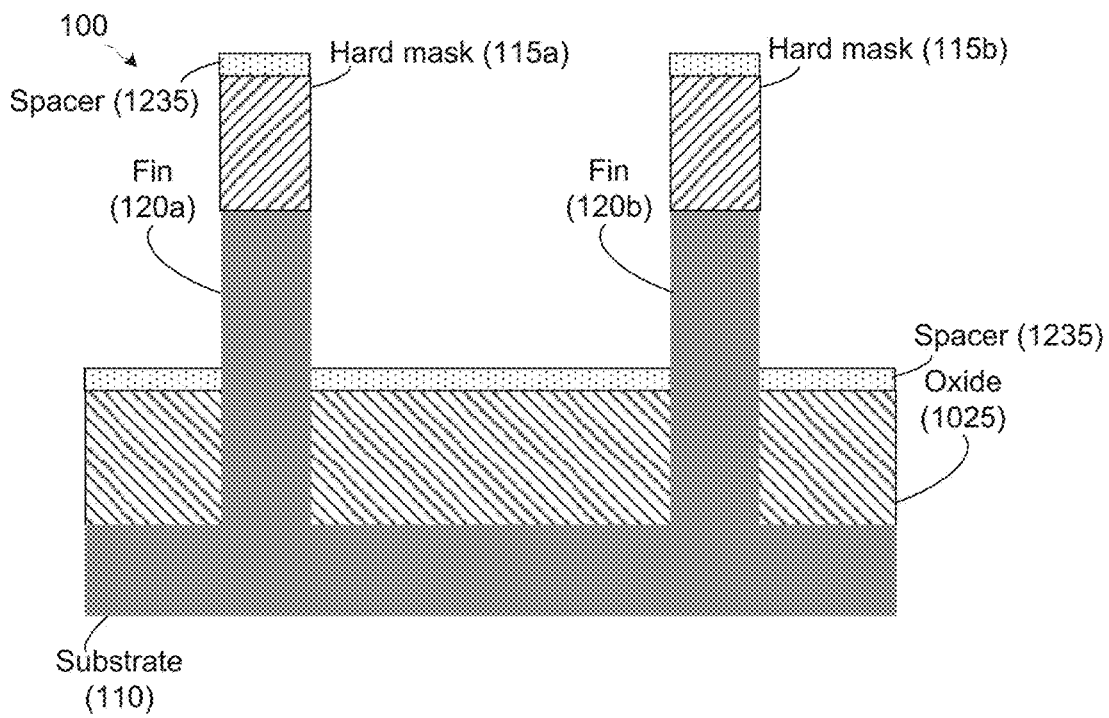
FIG. 12 illustrates a stylized X-cut cross-sectional depiction of the vFET device under manufacture with respect to a spacer formation process, in accordance with embodiments herein.
Figure 13:
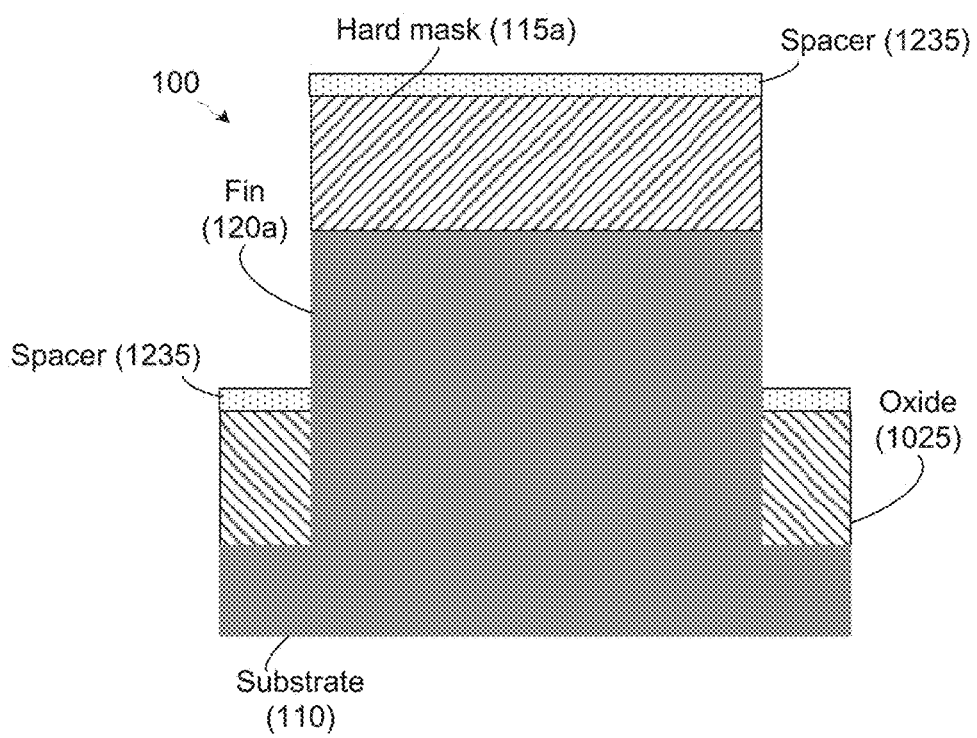
FIG. 13 illustrates a stylized Y-cut cross-sectional depiction of the vFET device under manufacture with respect to a spacer formation process, in accordance with embodiments herein.

FIG. 12 illustrates a stylized X-cut cross-sectional depiction and FIG. 13 illustrates a stylized Y-cut cross-sectional depiction of the vFET device under manufacture with respect to a spacer formation process, in accordance with embodiments herein. A spacer 1235 may be formed on horizontal surfaces, e.g., on the substrate 1235 and on the hard masks 115a and 115b (or the fins 120a and 120b, in embodiments wherein no hard mask was formed or has been removed prior, not shown). In embodiments, the portion of the spacer 1235 disposed on eh substrate 110 may be retained as a bottom spacer of a gate of the final vFET device 110, and the portion of the spacer 1235 disposed on the hard mask 115a and 115b may be removed during processing.

Figure 14:
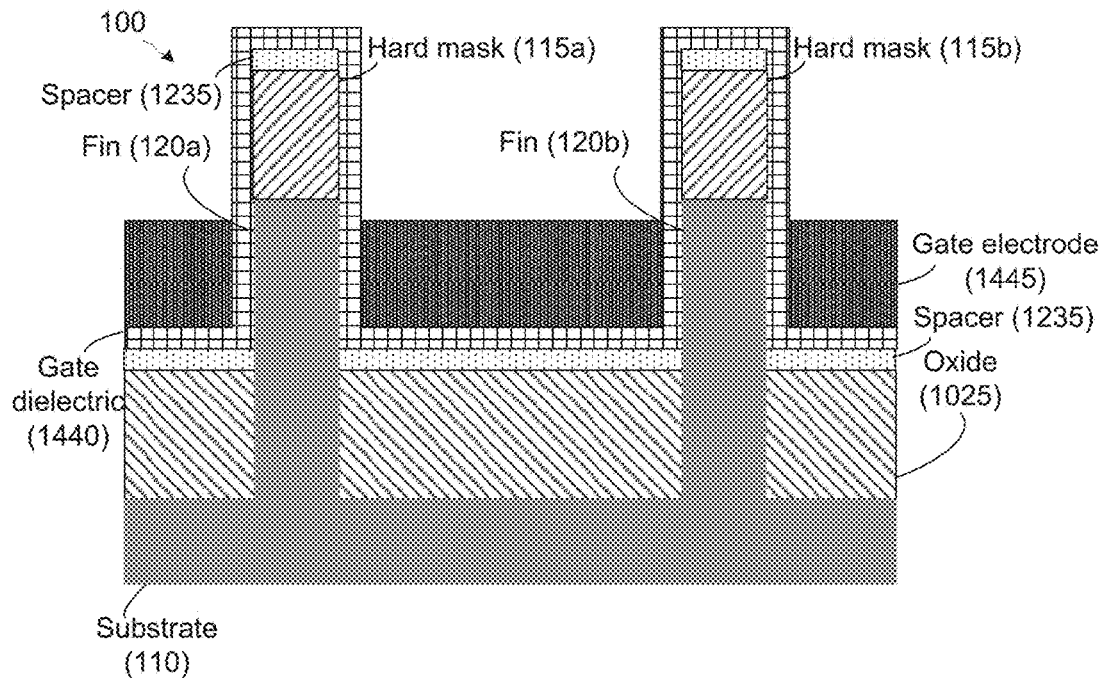
FIG. 14 illustrates a stylized X-cut cross-sectional depiction of the vFET device under manufacture with respect to gate formation processes, in accordance with embodiments herein.
Figure 15:
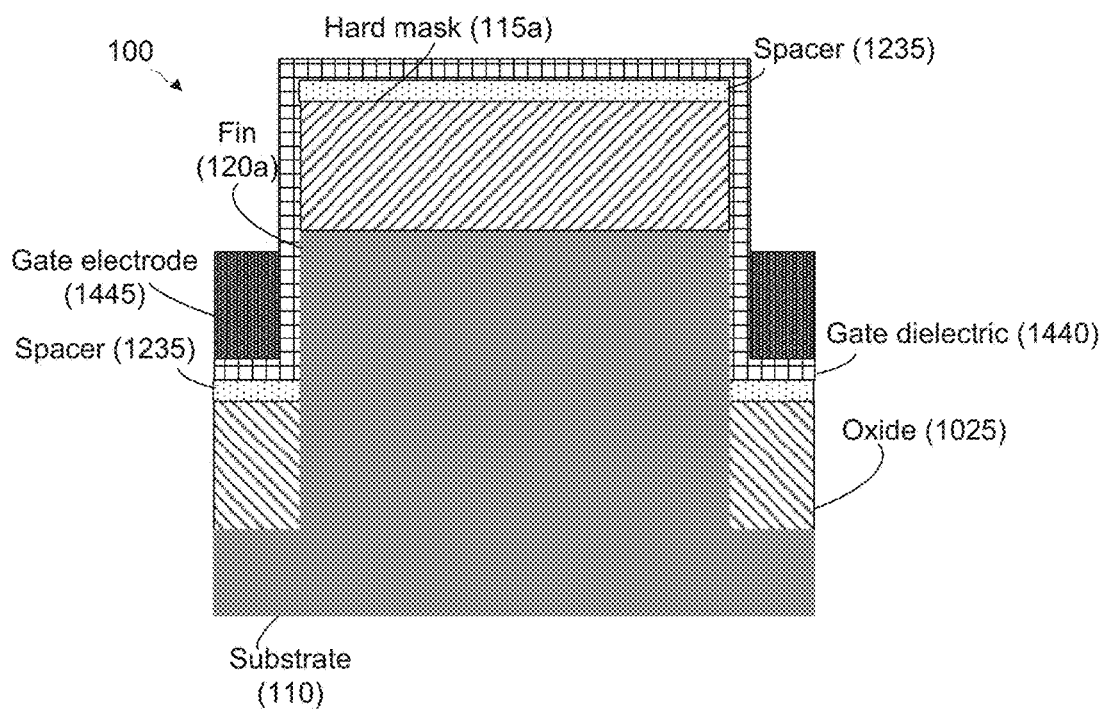
FIG. 15 illustrates a stylized Y-cut cross-sectional depiction of the vFET device under manufacture with respect to gate formation processes, in accordance with embodiments herein.

FIG. 14 illustrates a stylized X-cut cross-sectional depiction and FIG. 15 illustrates a stylized Y-cut cross-sectional depiction of the vFET device under manufacture with respect to gate formation processes, in accordance with embodiments herein. A gate dielectric 1440 may be conformally deposited over the spacer 1235 and the sidewalls of the fins 120a and 120b. In one embodiment, the gate dielectric 1440 may be a high-k metal dielectric. Subsequently, a gate electrode 1445 may be deposited on the gate dielectric 1440 up to any desired height. In one embodiment, the top of the gate electrode 1445 may be below the bottom of the hard mask 115 or below the bottom of the spacer 1235 atop each fin 120 if no hard mask is present or has been removed prior.

Figure 16:
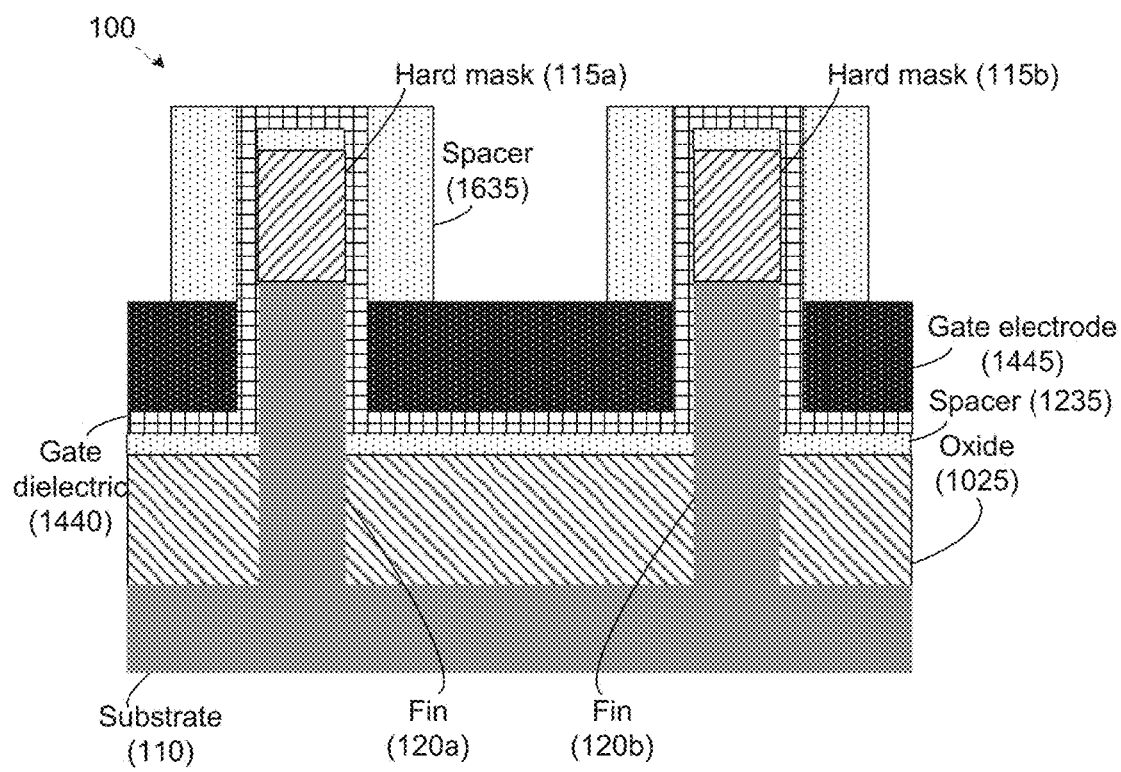
FIG. 16 illustrates a stylized X-cut cross-sectional depiction of the vFET device under manufacture with respect to a spacer formation process, in accordance with embodiments herein.
Figure 17:
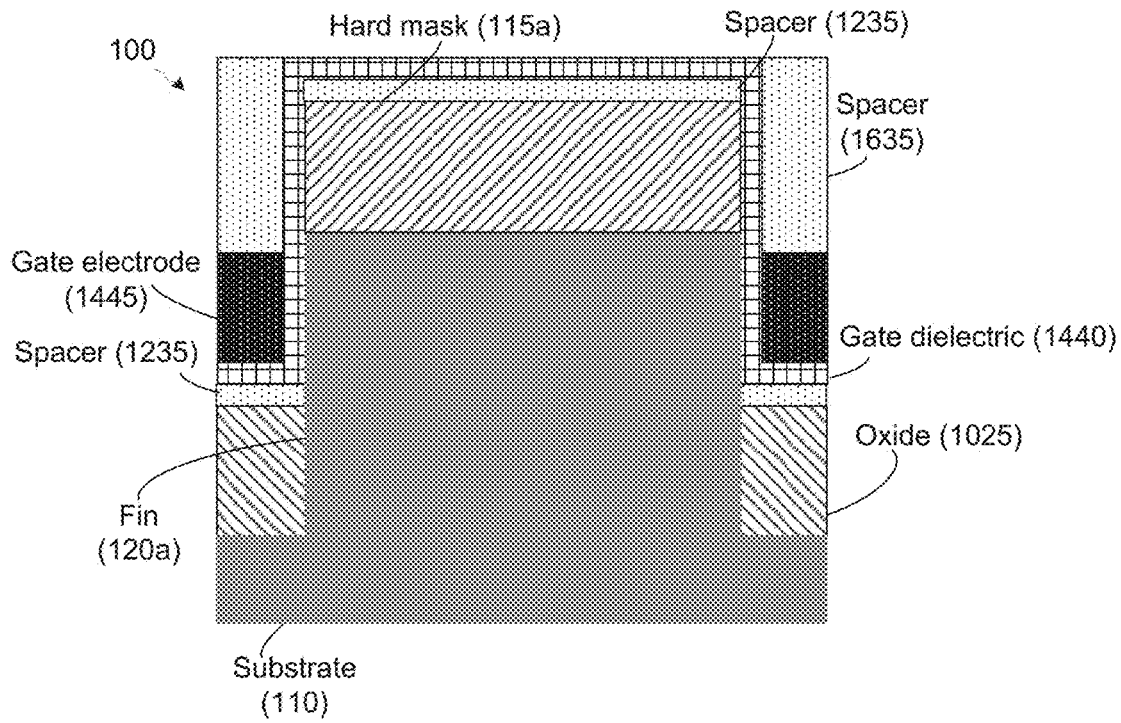
FIG. 17 illustrates a stylized Y-cut cross-sectional depiction of the vFET device under manufacture with respect to a spacer formation process, in accordance with embodiments herein.

FIG. 16 illustrates a stylized X-cut cross-sectional depiction and FIG. 17 illustrates a stylized Y-cut cross-sectional depiction of the vFET device under manufacture with respect to a spacer formation process, in accordance with embodiments herein. A spacer 1635 is formed on sidewalls of the fins 120a and 120b, over the gate dielectric 1440.

Figure 18:
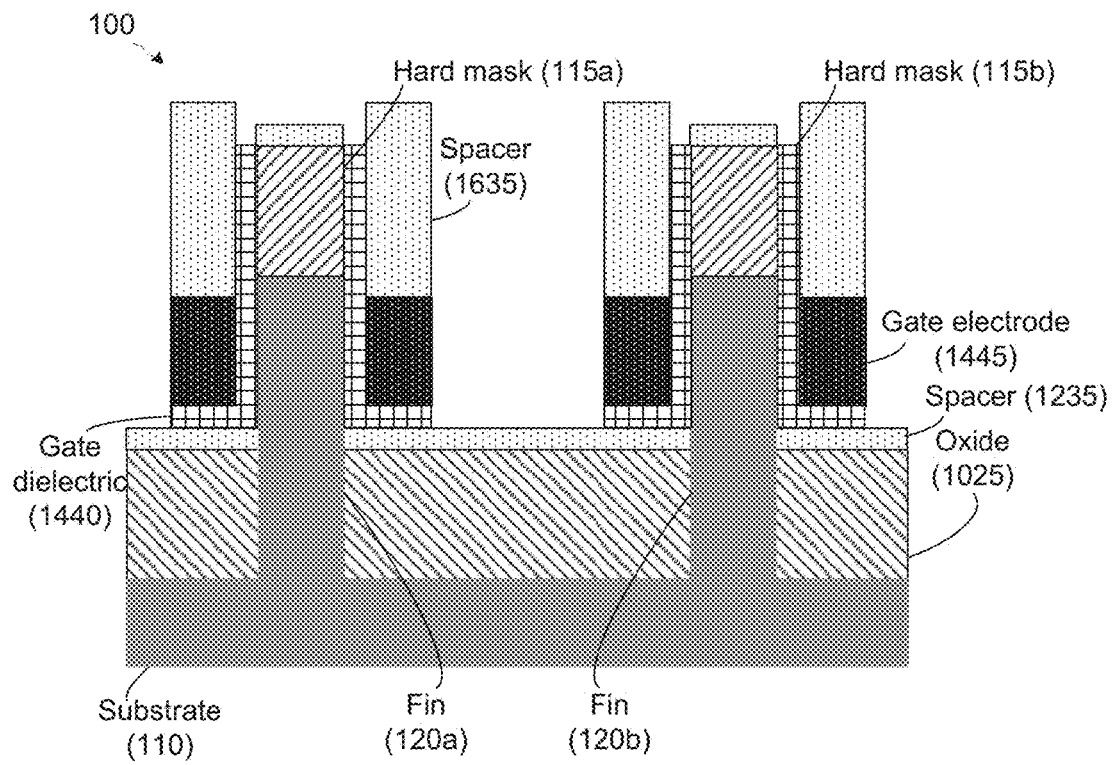
FIG. 18 illustrates a stylized X-cut cross-sectional depiction of the vFET device under manufacture with respect to gate etch processes, in accordance with embodiments herein.
Figure 19:
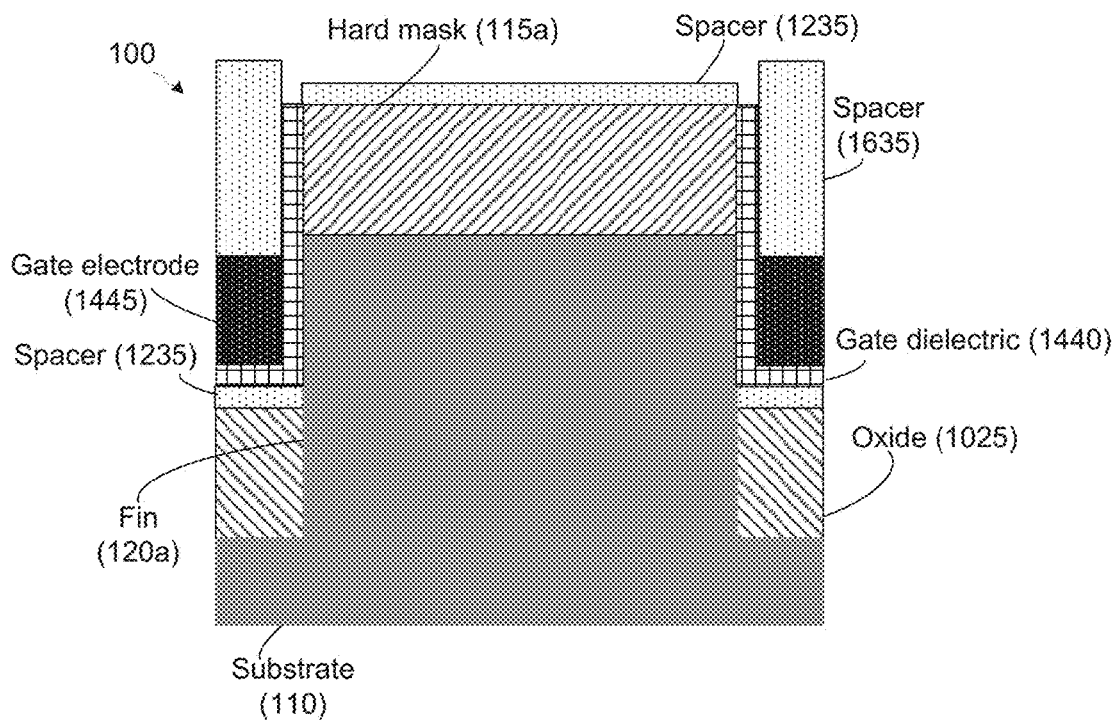
FIG. 19 illustrates a stylized Y-cut cross-sectional depiction of the vFET device under manufacture with respect to gate etch processes, in accordance with embodiments herein.

FIG. 18 illustrates a stylized X-cut cross-sectional depiction and FIG. 19 illustrates a stylized Y-cut cross-sectional depiction of the vFET device under manufacture with respect to gate etch processes, in accordance with embodiments herein. Material of the gate electrode 1445 is removed except for those portions of the gate electrode 1445 disposed under the spacer 1635. Simultaneously or subsequently, material of the gate dielectric 1440 is removed except for those portions of the gate dielectric 1440 disposed under the retained portions of the gate electrode 1445.

Figure 20:
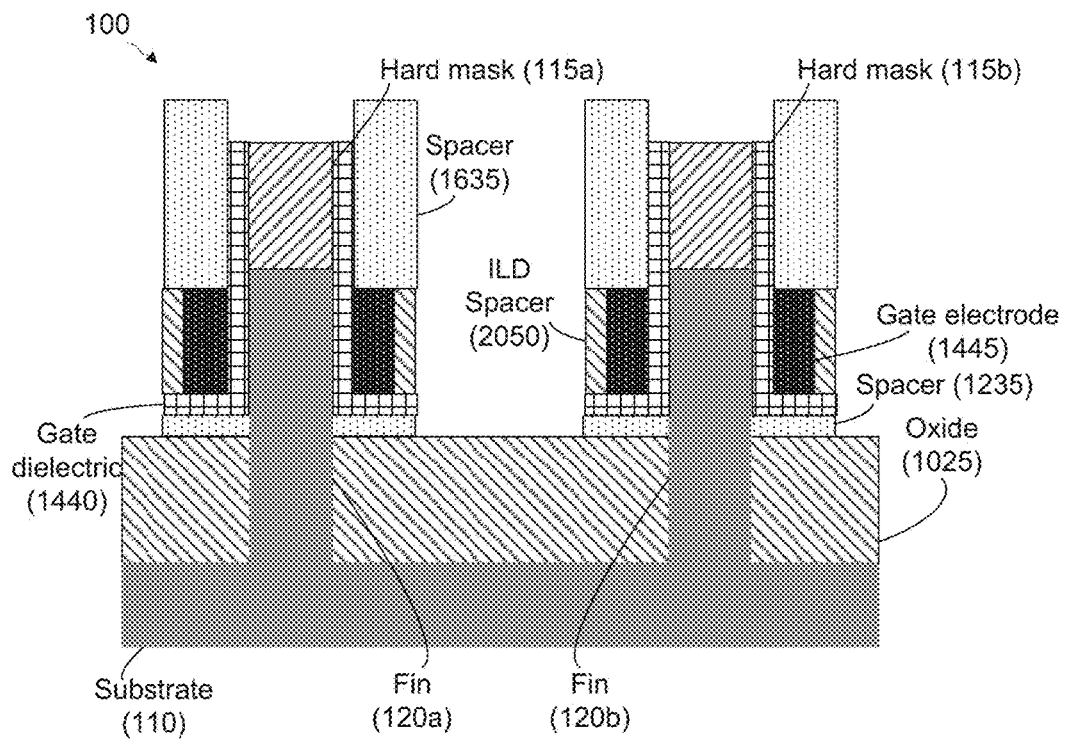
FIG. 20 illustrates a stylized X-cut cross-sectional depiction of the vFET device under manufacture with respect to an ILD spacer formation process, in accordance with embodiments herein.
Figure 21:
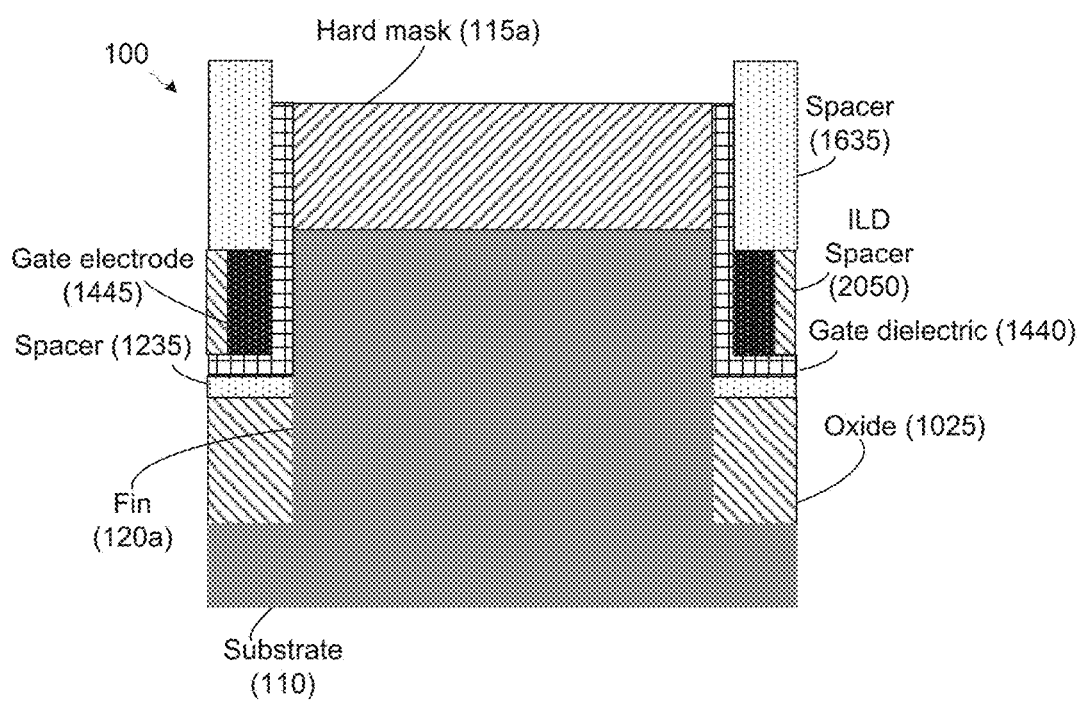
FIG. 21 illustrates a stylized Y-cut cross-sectional depiction of the vFET device under manufacture with respect to an ILD spacer formation process, in accordance with embodiments herein.

FIG. 20 illustrates a stylized X-cut cross-sectional depiction and FIG. 21 illustrates a stylized Y-cut cross-sectional depiction of the vFET device under manufacture with respect to spacer removal and interlayer dielectric (ILD) spacer formation processes, in accordance with embodiments herein. The spacer 1235 is removed except for portions of the spacer 1235 disposed under the gate dielectric 1440. An ILD spacer 2050 is formed after partially removing portions of the gate electrode 1445 laterally disposed farthest from the fins 120*a* and 120*b*, to yield a gap in which the ILD spacer 2050 is then formed. Partial removal of the spacer 1235 and formation of the ILD spacer 2050 may be performed in either order.

Figure 22:
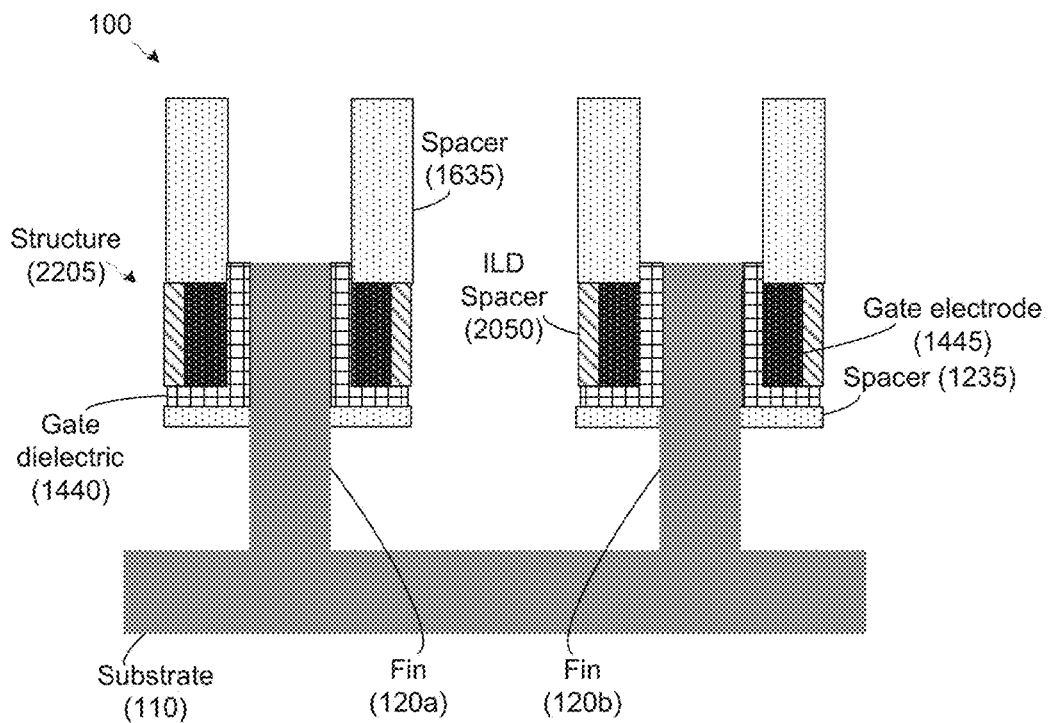
FIG. 22 illustrates a stylized X-cut cross-sectional depiction of the vFET device under manufacture with respect to hard mask and oxide removal processes, in accordance with embodiments herein.
Figure 23:
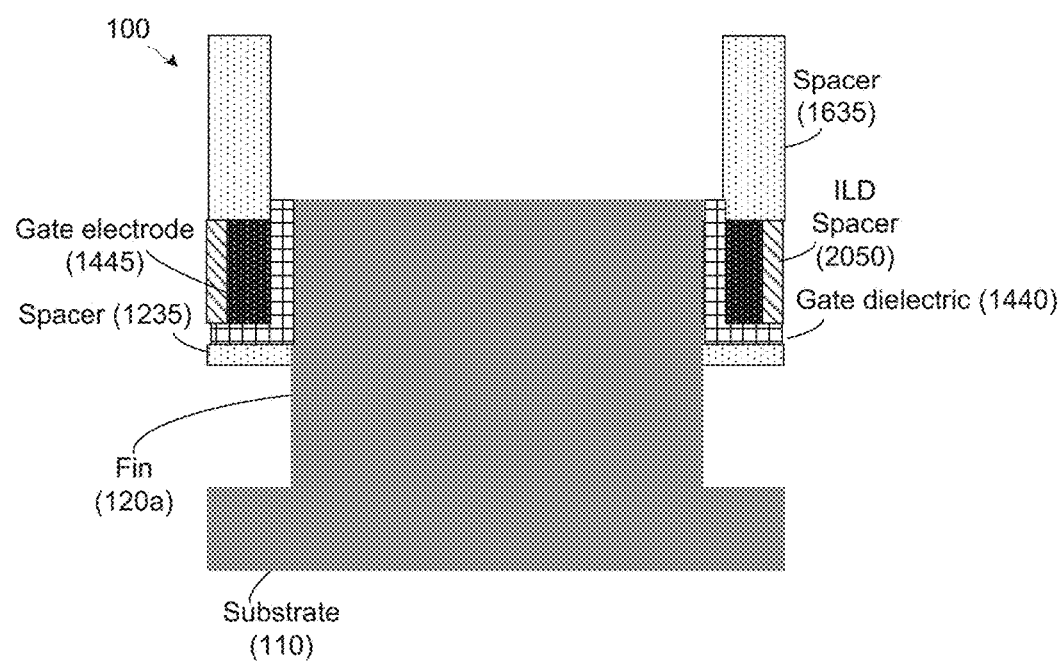
FIG. 23 illustrates a stylized Y-cut cross-sectional depiction of the vFET device under manufacture with respect to hard mask and oxide removal processes, in accordance with embodiments herein.

FIG. 22 illustrates a stylized X-cut cross-sectional depiction and FIG. 23 illustrates a stylized Y-cut cross-sectional depiction of the vFET device under manufacture with respect to hard mask and oxide removal processes, in accordance with embodiments herein. The hard masks 115*a* and 115*b* may be removed as described with respect to FIGS. 8-9. The oxide 1025 may be removed before or after removal of the hard masks 115*a* and 115*b*.

The oxide etch and hard mask removal processes yield a structure 2205, containing the gate electrode 1445, the gate dielectric 1445, the spacer 1235 on the bottom of the structure 2205, the ILD spacer 2050 disposed on the outside of the structure 2205, and a spacer 1635 disposed on the gate electrode 1445 and the ILD spacer 2050. The structure 2205 is disposed on at least a middle portion of each sidewall of each fin 120*a*, 120*b*. The structure 2205 is not disposed on the top of each fin 120*a* and 120*b*. The structure 2205 is also not disposed on a lower portion of each sidewall and the substrate 110.

The structure 2205 may be referred to herein as a gate.

In summary, FIGS. 10-23 depict one set of processes for forming a structure 2205 on a middle portion of each sidewall of a fin, whereby a lower portion of each sidewall of the fin adjacent the semiconductor substrate and at least a top of the fin are uncovered by the structure. The structure 2205 includes a gate electrode 1445 and a gate dielectric 1440, which are present before the formation of top and bottom epitaxial source/drain regions. Accordingly, the set of processes depicted in FIGS. 10-23 may be referred to as components of a "gate-first" process.

Turning to FIGS. 24-33, another set of processes for forming a structure on a middle portion of each sidewall of a fin, whereby a lower portion of each sidewall of the fin adjacent the semiconductor substrate and at least a top of the fin are uncovered by the structure, are shown and will be described below.

Figure 24:
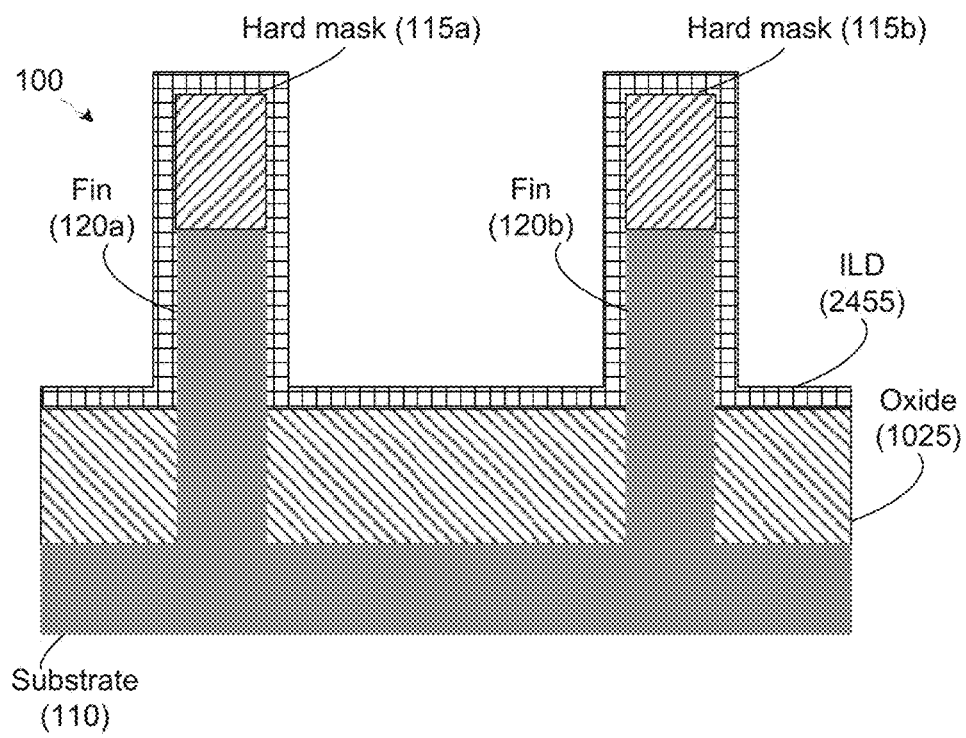
FIG. 24 illustrates a stylized X-cut cross-sectional depiction of the vFET device under manufacture of FIG. 2 with respect to oxide and ILD deposition processes, in accordance with embodiments herein.
Figure 25:
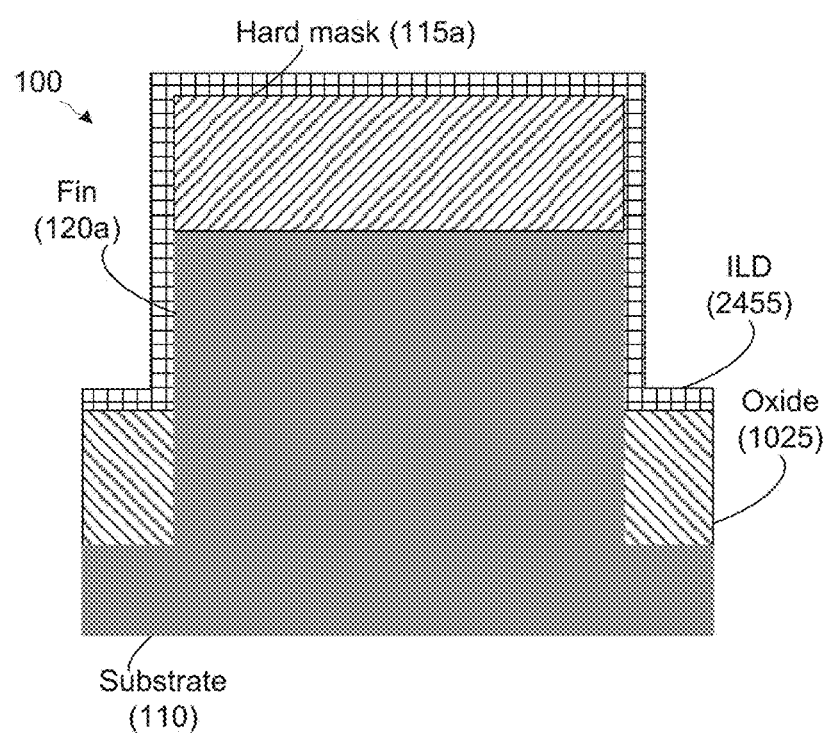
FIG. 25 illustrates a stylized Y-cut cross-sectional depiction of the vFET device under manufacture of FIG. 3 with respect to oxide and ILD deposition processes, in accordance with embodiments herein.

FIG. 24 illustrates a stylized X-cut cross-sectional depiction and FIG. 25 illustrates a stylized Y-cut cross-sectional depiction of the vFET device under manufacture of FIGS. 2-3, respectively, with respect to oxide and ILD deposition processes, in accordance with embodiments herein. An oxide 1025 is formed on the substrate 110 between and beside the fins 120*a* and 120*b*. Subsequently, an ILD 2455 is deposited over the oxide 1025, on the sidewalls of the fins 120*a* and 120*b*, and on the sides and tops of the hard masks 115*a* and 115*b*. The ILD 2455 would be disposed on the tops of the fins 120*a* and 120*b* if the hard masks 115*a* and 115*b* were omitted or removed previously (not shown).

Figure 26:
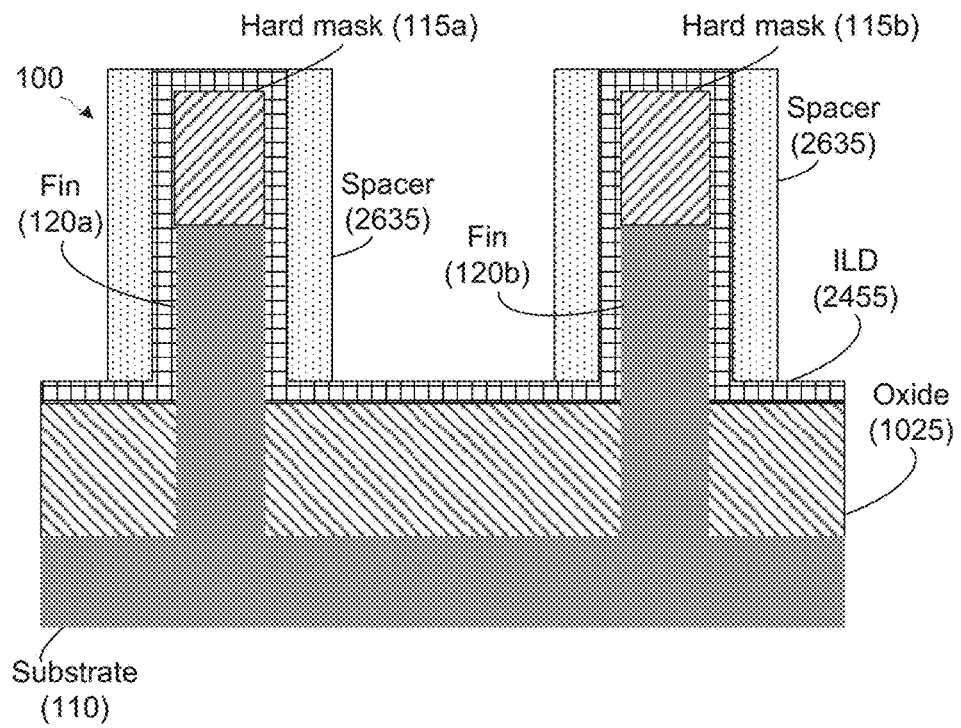
FIG. 26 illustrates a stylized X-cut cross-sectional depiction of the vFET device under manufacture with respect to a spacer formation process, in accordance with embodiments herein.
Figure 27:
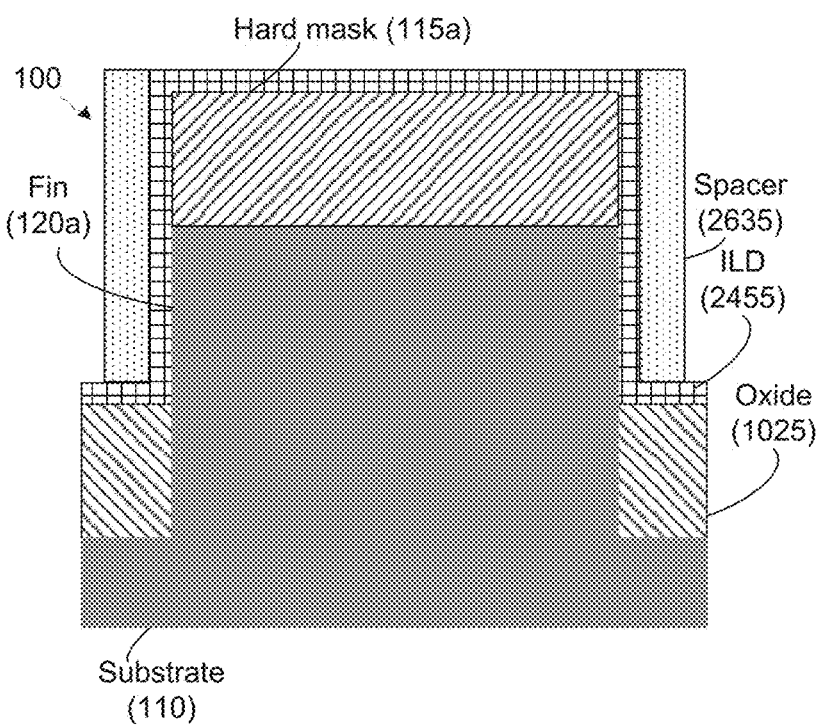
FIG. 27 illustrates a stylized Y-cut cross-sectional depiction of the vFET device under manufacture with respect to a spacer formation process, in accordance with embodiments herein.

FIG. 26 illustrates a stylized X-cut cross-sectional depiction and FIG. 27 illustrates a stylized Y-cut cross-sectional depiction of the vFET device under manufacture with respect to a spacer formation process, in accordance with embodiments herein. A spacer 2635 is formed over the ILD 2455 on the sidewalls of the fins 120*a* and 120*b* and the hard masks 115*a* and 115*b*.

Figure 28:
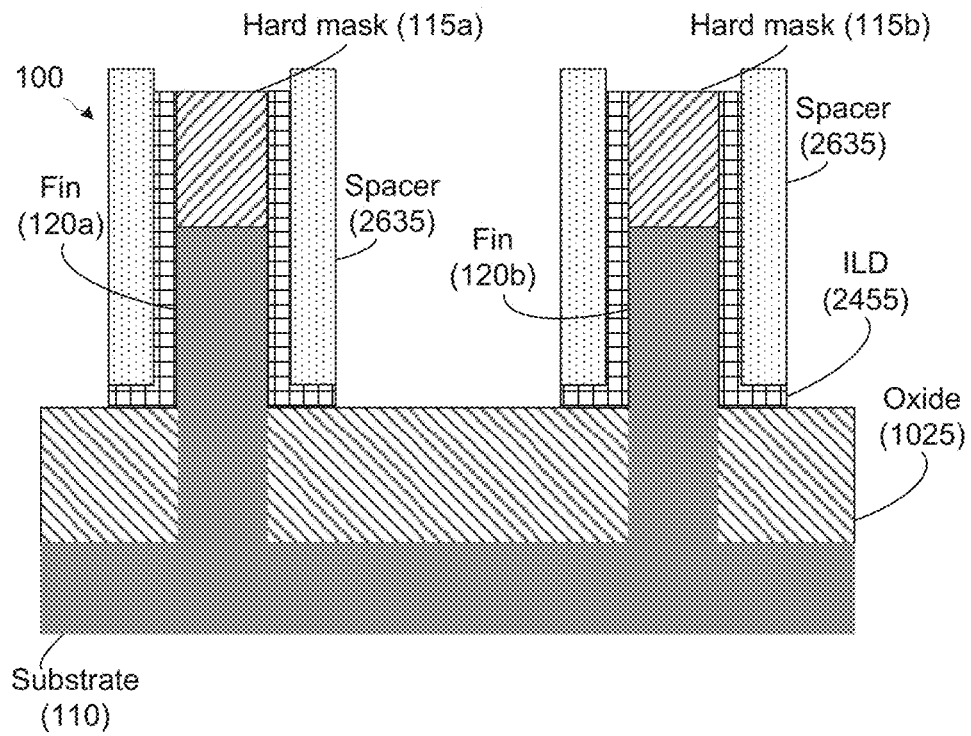
FIG. 28 illustrates a stylized X-cut cross-sectional depiction of the vFET device under manufacture with respect to an ILD etch process, in accordance with embodiments herein.
Figure 29:
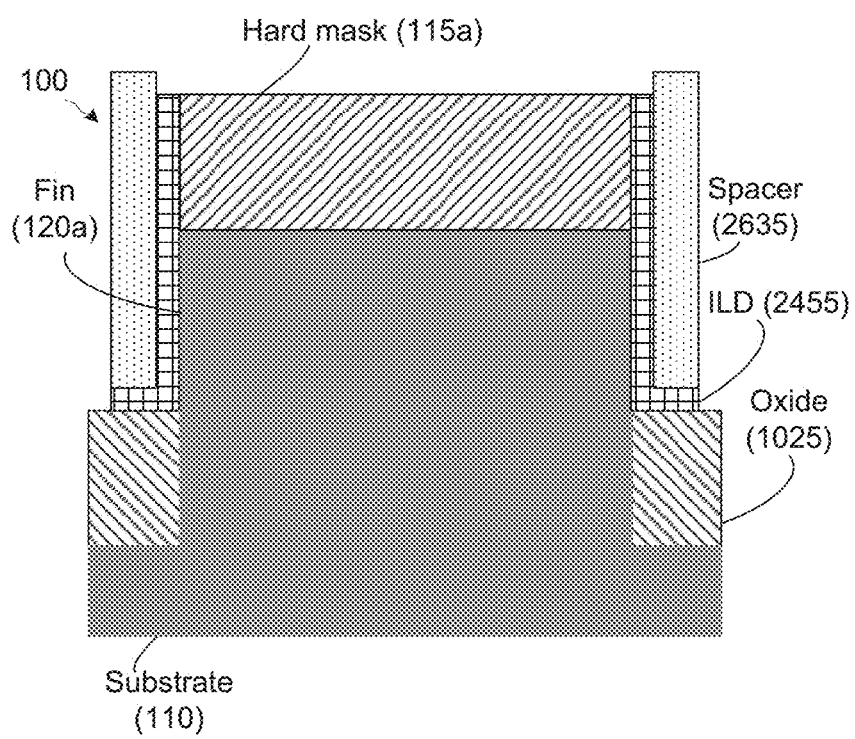
FIG. 29 illustrates a stylized Y-cut cross-sectional depiction of the vFET device under manufacture with respect to an ILD etch process, in accordance with embodiments herein.

FIG. 28 illustrates a stylized X-cut cross-sectional depiction and FIG. 29 illustrates a stylized Y-cut cross-sectional depiction of the vFET device under manufacture with respect to an ILD etch process, in accordance with embodiments herein. Portions of the ILD 2455 are removed from the oxide surface 1025 and the tops of the hard masks 115*a* and 115*b*, retaining other portions of the ILD 2455 under the spacer 2635 and along the sidewalls of the fins 120*a* and 120*b* and the hard masks 115*a* and 115*b*.

Figure 30:
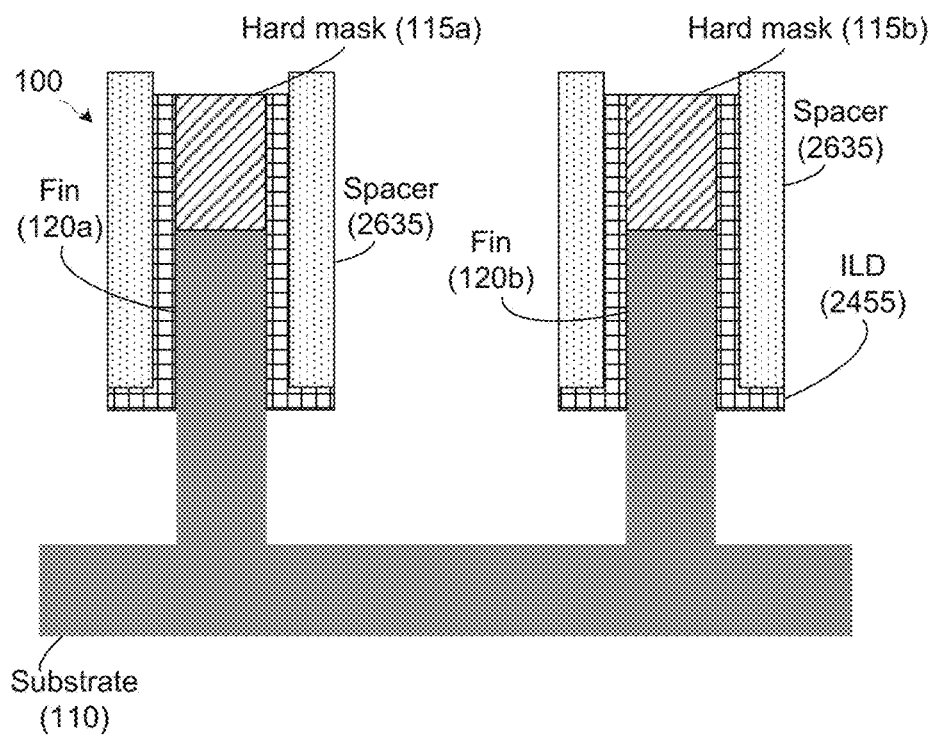
FIG. 30 illustrates a stylized X-cut cross-sectional depiction of the vFET device under manufacture with respect to an oxide removal process, in accordance with embodiments herein.
Figure 31:
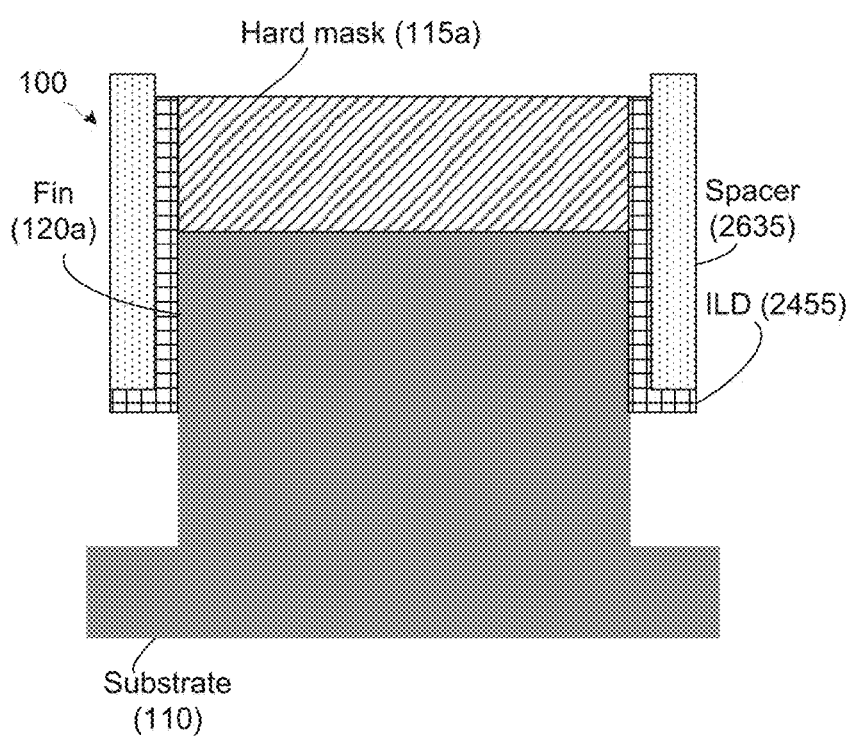
FIG. 31 illustrates a stylized Y-cut cross-sectional depiction of the vFET device under manufacture with respect to an oxide removal process, in accordance with embodiments herein.

FIG. 30 illustrates a stylized X-cut cross-sectional depiction and FIG. 31 illustrates a stylized Y-cut cross-sectional depiction of the vFET device under manufacture with respect to an oxide removal process, in accordance with embodiments herein. The oxide 1025 is removed, thereby exposing a lower portion of each sidewall of the fins 120*a* and 120*b*.

Figure 32:
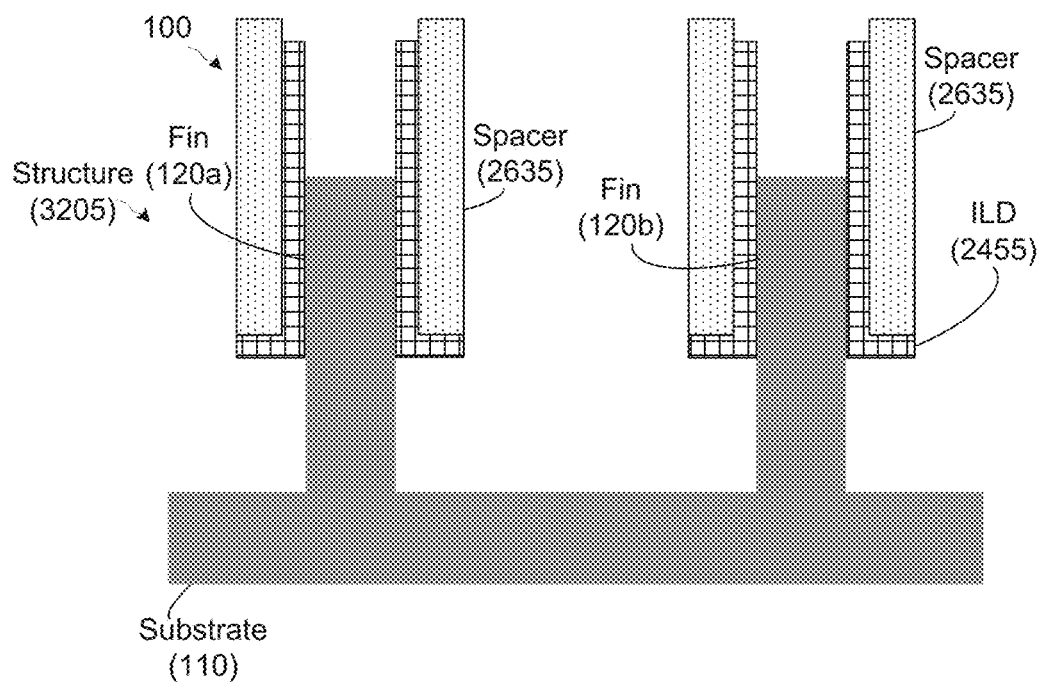
FIG. 32 illustrates a stylized X-cut cross-sectional depiction of the vFET device under manufacture with respect to a hard mask removal process, in accordance with embodiments herein.
Figure 33:
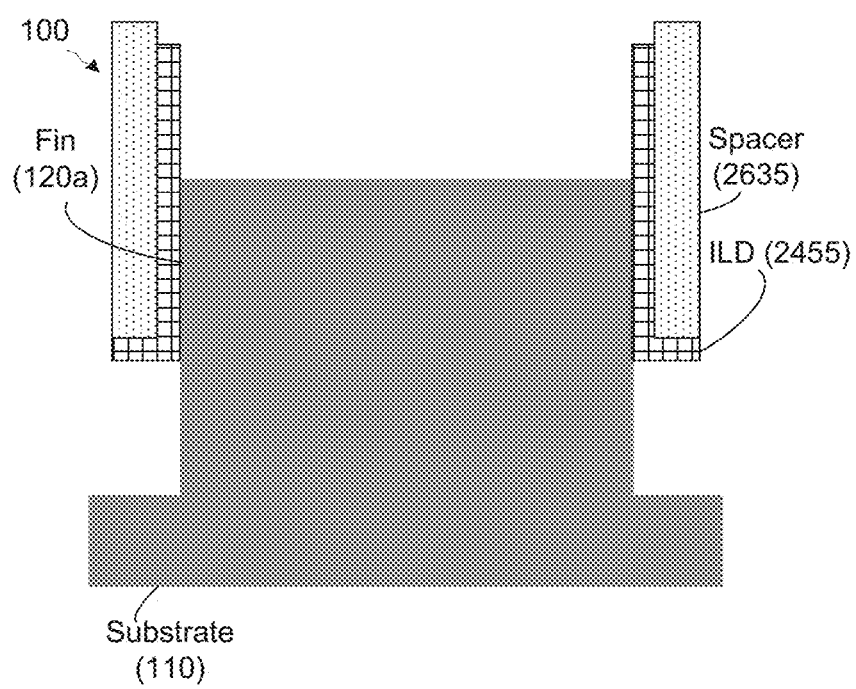
FIG. 33 illustrates a stylized Y-cut cross-sectional depiction of the vFET device under manufacture with respect to a hard mask removal process, in accordance with embodiments herein.

FIG. 32 illustrates a stylized X-cut cross-sectional depiction and FIG. 33 illustrates a stylized Y-cut cross-sectional depiction of the vFET device under manufacture with respect to a hard mask removal process, in accordance with embodiments herein. The hard masks 115*a* and 115*b* are removed from the tops of the fins 120*a* and 120*b*, if the hard masks were present and not removed prior to removal of the oxide 1025.

The hard mask removal process yields a structure 3205, including the ILD 2455 and the spacer 2635. The structure 3205 is disposed on at least a middle portion of each sidewall of each fin 120*a*, 120*b*. The structure 3205 is not disposed on the top of each fin 120*a* and 120*b*, nor is it disposed on a lower portion of each sidewall of each fin 120*a* and 120*b*, nor the substrate 110.

The structure 3205 may be referred to herein as a dummy gate. In later processes, after formation of epitaxial top and bottom source/drains, the dummy gate may be removed and replaced with a functional gate of a vFET device. Accordingly, the set of processes depicted in FIGS. 24-33 may be referred to as part of a "gate-last" process.

In summary, FIGS. 24-33 depict one set of processes for forming a structure on a middle portion of each sidewall of a fin, whereby a lower portion of each sidewall of the fin adjacent the semiconductor substrate and at least a top of the fin are uncovered by the structure.

Having presented three exemplary techniques for forming a structure on a middle portion of each sidewall of a fin in FIGS. 2-33, subsequent figures will depict processes for growing an epitaxial top source/drain (S/D) region on at least the top of the fin, and an epitaxial bottom S/D region on the lower portion of each sidewall of the fin and on the semiconductor substrate.

Figure 34:
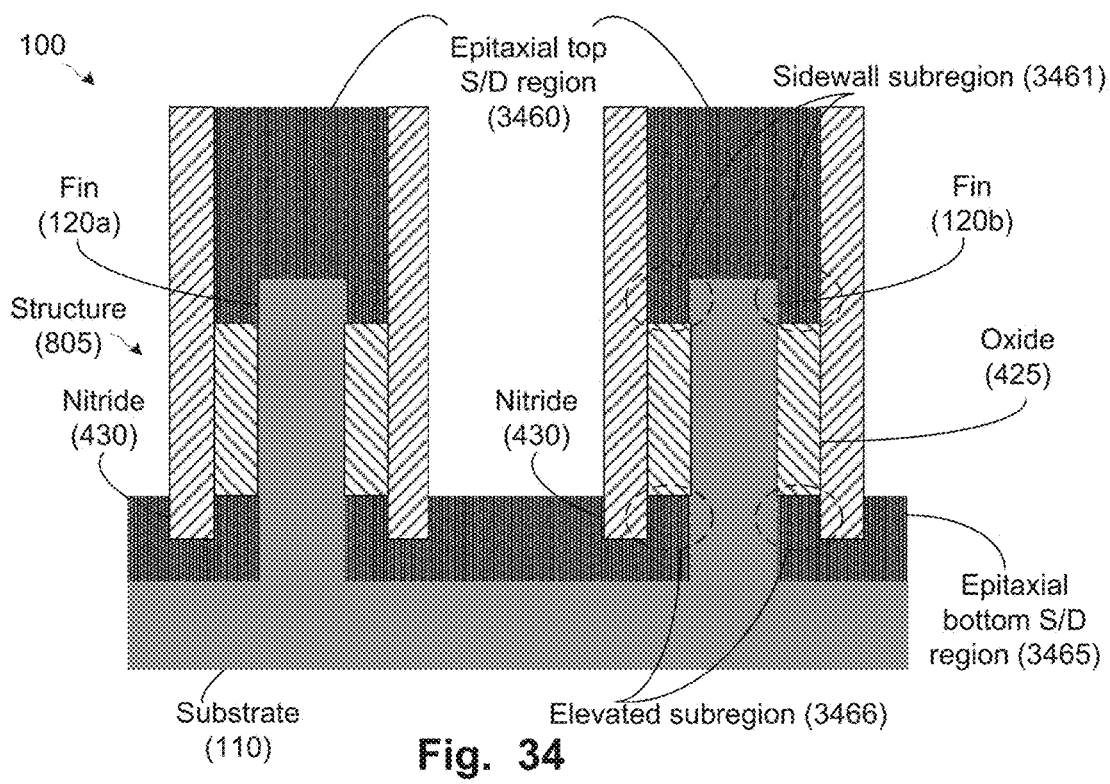
FIG. 34 illustrates a stylized X-cut cross-sectional depiction of the vFET device under manufacture of FIG. 8 with respect to an epitaxial top and bottom S/D region growth process, in accordance with embodiments herein.
Figure 35:
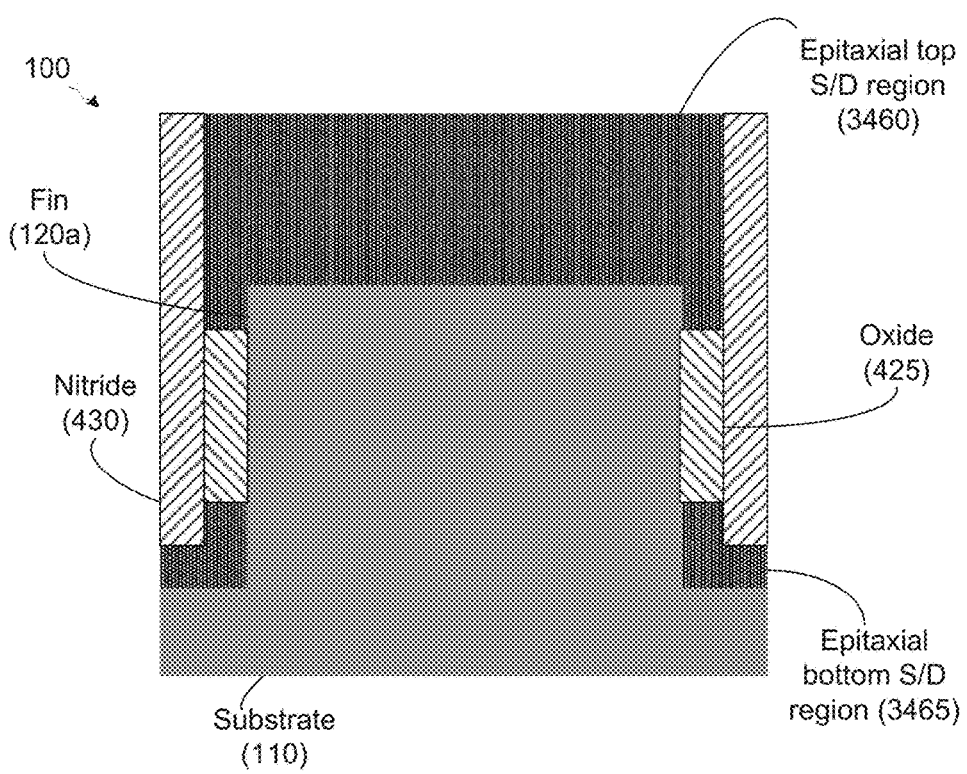
FIG. 35 illustrates a stylized Y-cut cross-sectional depiction of the vFET device under manufacture of FIG. 9 with respect to an epitaxial top and bottom S/D region growth process, in accordance with embodiments herein.

FIG. 34 illustrates a stylized X-cut cross-sectional depiction and FIG. 35 illustrates a stylized Y-cut cross-sectional depiction of the vFET device under manufacture of FIGS. 8-9, respectively, with respect to an epitaxial top and bottom S/D region growth process, in accordance with embodiments herein. In the depicted embodiment, a single epitaxial growth process forms both an epitaxial top S/D region 3460 and an epitaxial bottom S/D region 3465 of the vFET device 100.

Generally, epitaxial growth techniques will be known to the person of ordinary skill in the art. The epitaxial top S/D region 3460 and the epitaxial bottom S/D region 3465 may include the same material as the substrate 110 and fins 120*a* and 120*b*, or different materials. In one embodiment, the epitaxial top S/D region 3460 and the epitaxial bottom S/D region 3465 may contain SiGe.

The epitaxial top S/D region 3460 and the epitaxial bottom S/D region 3465 may be non-uniform in composition. In one embodiment, epitaxial growth may begin by forming epitaxial SiGe on the substrate 110, the lower portions of each sidewall of each fin 120*a* and 120*b*, and on the upper portions each sidewall and the tops of each fin 120*a* and 120*b*. Epitaxial growth may continue by forming epitaxial silicon over the epitaxial SiGe. In this embodiment, the portions of the epitaxial top S/D region 3460 and the epitaxial bottom S/D region 3465 exposed to subsequent semiconductor manufacturing processes contain silicon, which may be more resistant than SiGe to side reactions induced by such subsequent semiconductor manufacturing processes.

In another embodiment, epitaxial growth may begin by forming epitaxial $Si_yGe_{1-y}$ on the substrate 110, the lower portions of each sidewall of each fin 120*a* and 120*b*, and on the upper portions each sidewall and the tops of each fin 120*a* and 120*b*. The value of y may be relatively low, i.e. the silicon-germanium has a relatively high germanium concentration. The conditions of the epitaxial growth may then be continually adjusted by stepping up the value of y to a desired final value, which may be 1. In other words, the epitaxial growth process of this embodiment may impart to the epitaxial top S/D region 3460 and the epitaxial bottom S/D region 3465 a germanium concentration gradient, wherein the germanium concentration decreases with increasing distance from the substrate 110, the lower portions of each sidewall of each fin 120*a* and 120*b*, and the upper portions of each sidewall and the tops of each fin 120*a* and 120*b*.

Although the epitaxial top S/D region 3460 and the epitaxial bottom S/D region 3465 may have non-uniform structure as described above, for convenience, they will be depicted uniformly in the figures.

The structure 805 constrains the lateral growth of the epitaxial top S/D region 3460. Accordingly, merging of the top S/D regions on neighboring fins may be reduced or avoided. Also, if an upper portion of each sidewall of a fin 120 is exposed after FIGS. 8-9, the epitaxial top S/D region 3460 may grow on the exposed upper portion, to form a sidewall subregion 3461 of the epitaxial top S/D region 3460.

The epitaxial bottom S/D region 3465 may grow around the bottom of the nitride 430 of the structure 805. The portion of the epitaxial bottom S/D region 3465 laterally disposed between the nitride 430 and the lower portion of the sidewall of a fin 120 may be termed an elevated subregion 3466 of the epitaxial bottom S/D region 3465. The nitride 430 may constrain growth of both the epitaxial top S/D region 3460 and the epitaxial bottom S/D region 3465 such that the elevated subregion 3466 is vertically aligned with the epitaxial top S/D region 3460, i.e., the outer side of the elevated subregion 3466 is substantially coplanar with the corresponding outer side of the epitaxial top S/D region 3460.

In other embodiments, not shown, epitaxial growth of the epitaxial bottom S/D region 3465 in the area between the nitride 430 and a fin 120 may be incomplete, i.e., an air gap may exist in part or all of the space occupied by the elevated subregion 3466 in FIG. 34.

In FIGS. 34-35, the top of the epitaxial top S/D region 3460 is shown as being coplanar with the top of the nitride 430 of the structure 805. In other embodiments, the top of the epitaxial top S/D region 3460 may be above or below the top of the nitride 430 of the structure 805. Further, the top of the epitaxial top S/D region 3460 need not be flat, but instead may be higher towards the center than at the sides. Similarly, the top of the epitaxial bottom S/D region 3465 need not be coplanar with the bottom of the oxide 425, and/or need not be flat, but instead may be higher midway between the fins 120*a* and 120*b* than in proximity to a fin 120.

The epitaxial S/D regions 3460, 3465 shown in FIGS. 34-35 may wrap around a fin 120 and surround a vFET channel in the fin 120. The epitaxial S/D regions 3460, 3465 may impart stress to the vFET channel, which may enhance functionality of the vFET in some circumstances. Also, by forming epitaxial S/D regions 3460, 3465 in one process, uniformity of the junctions between the vFET channel and a source or drain is expected to increase.

Figure 36:
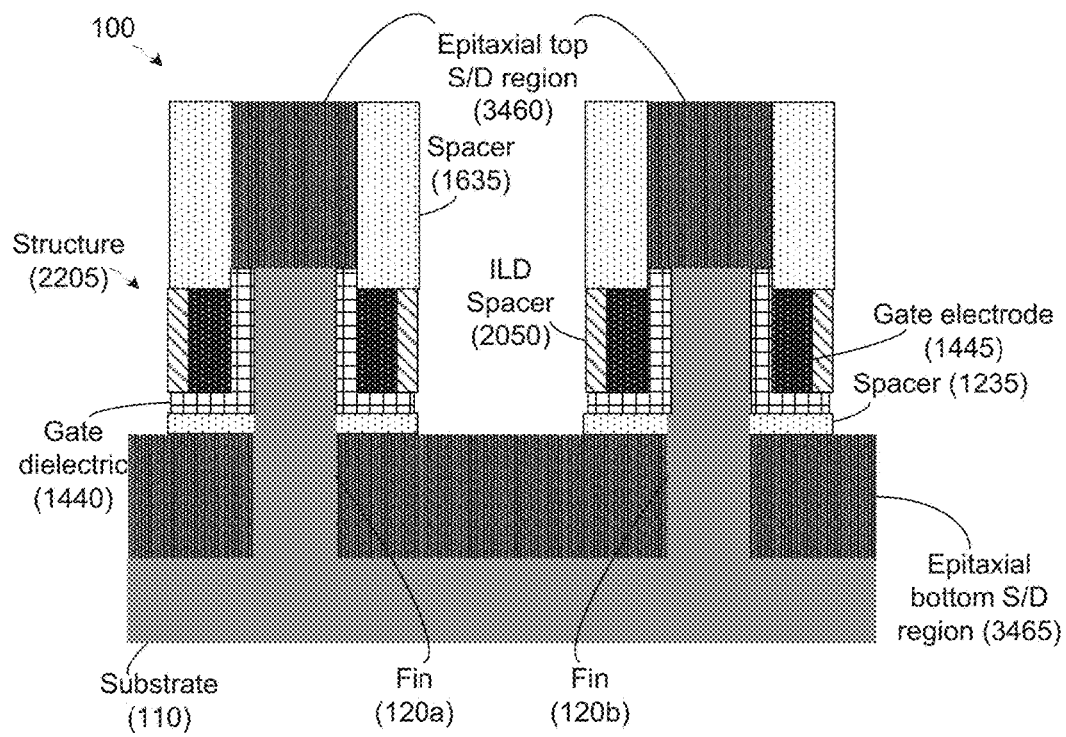
FIG. 36 illustrates a stylized X-cut cross-sectional depiction of the vFET device under manufacture of FIG. 22 with respect to an epitaxial top and bottom S/D region growth process, in accordance with embodiments herein.
Figure 37:
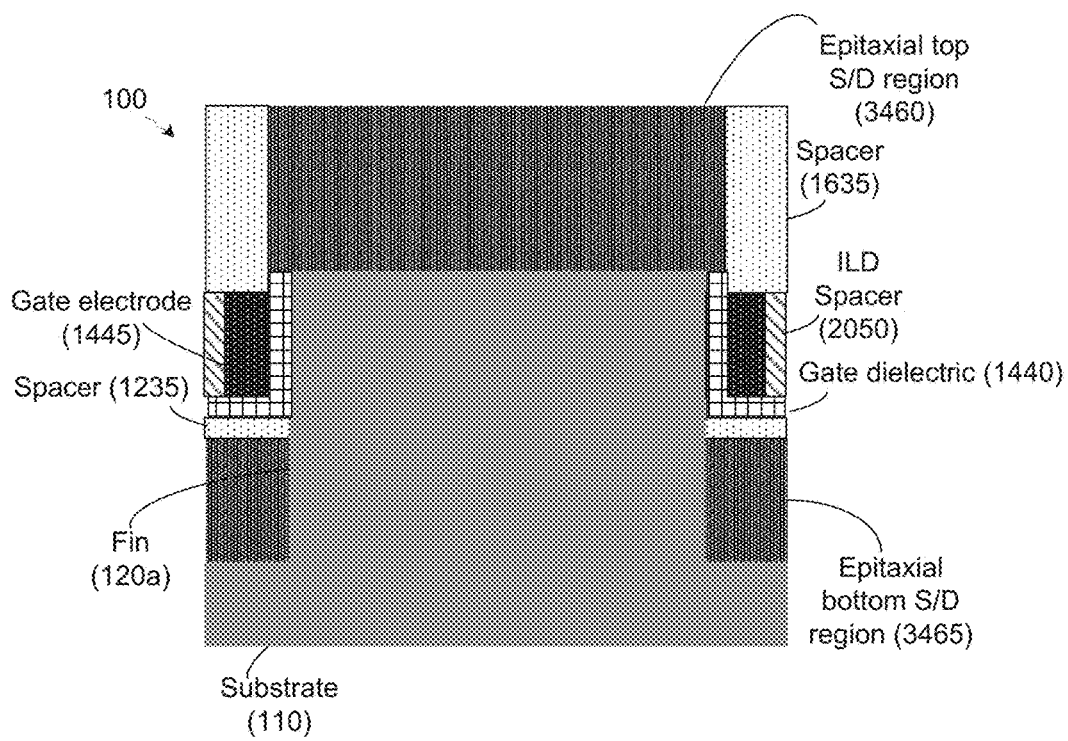
FIG. 37 illustrates a stylized Y-cut cross-sectional depiction of the vFET device under manufacture of FIG. 23 with respect to an epitaxial top and bottom S/D region growth process, in accordance with embodiments herein.

Another epitaxial growth process is depicted in FIGS. 36-37. FIG. 36 illustrates a stylized X-cut cross-sectional depiction and FIG. 37 illustrates a stylized Y-cut cross-sectional depiction of the vFET device under manufacture of FIGS. 22-23, respectively, with respect to an epitaxial top and bottom S/D region growth process, in accordance with embodiments herein. The epitaxial growth of epitaxial top S/D region 3460 and the epitaxial bottom S/D region 3465 may be as described above. Because the structure 2205 is disposed on the sidewalls up to the tops of the fins 120*a* and 120*b*, a sidewall subregion (such as sidewall subregion 3461, shown in FIG. 34) cannot be formed. Similarly, because the structure 2205 has a flat bottom from the sidewall of a fin 120 to the outer side of the structure 2205, an elevated subregion (such as elevated subregion 3466, shown in FIG. 34) also cannot be formed.

If epitaxial growth were performed on the vFET device 100 depicted in FIGS. 32-33, similar considerations would apply, with the exception being the components of the structure 3205 would differ from the components of the structure 2205. Accordingly, epitaxial growth on the vFET device 100 depicted in FIGS. 32-33 is not shown in the figures for brevity.

Regardless of the particular embodiment depicted, FIGS. 34-37 depict two processes for growing an epitaxial top source/drain (S/D) region on at least the top of a fin, and an epitaxial bottom S/D region on the lower portion of each sidewall of a fin and on a semiconductor substrate.

FIGS. 38-41 present one set of processes for replacing a dummy gate, such as structure 805, with a gate. The depicted process may also be applied to the person of ordinary skill in the art to replace structure 3205 shown in FIG. 32 with a gate.

Figure 38:
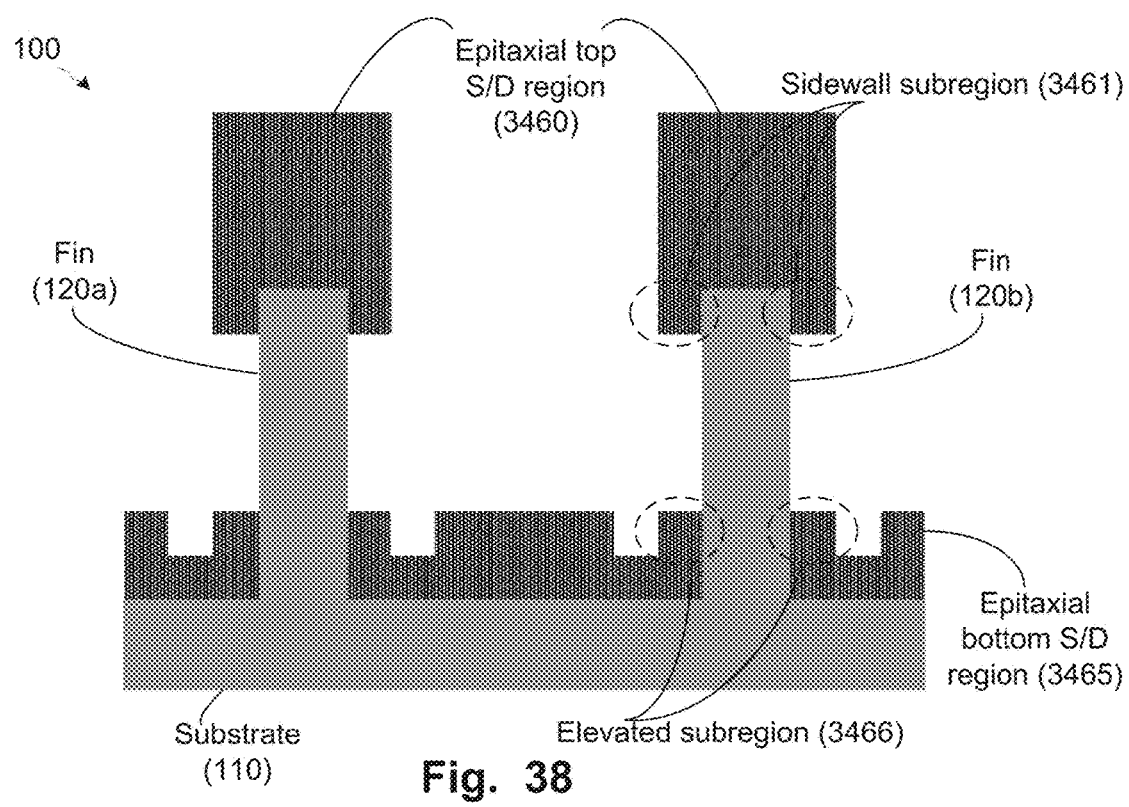
FIG. 38 illustrates a stylized X-cut cross-sectional depiction of the vFET device under manufacture of FIG. 34 with respect to oxide and nitride liner removal processes, in accordance with embodiments herein.
Figure 39:
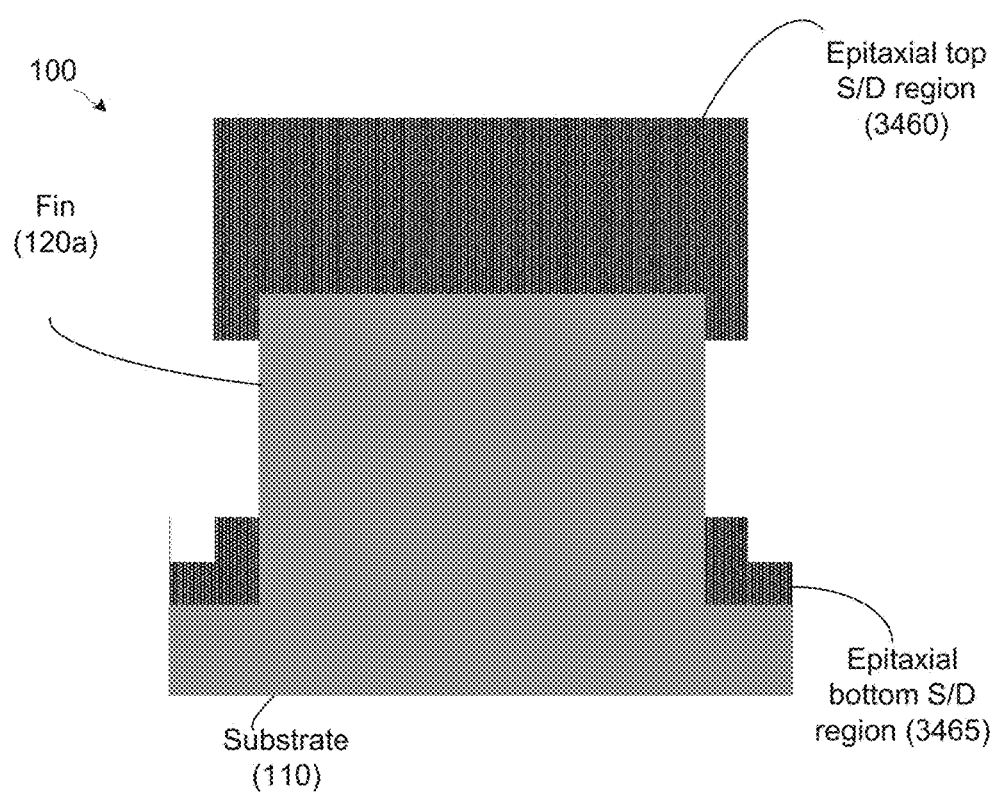
FIG. 39 illustrates a stylized Y-cut cross-sectional depiction of the vFET device under manufacture of FIG. 35 with respect to oxide and nitride liner removal processes, in accordance with embodiments herein.

FIG. 38 illustrates a stylized X-cut cross-sectional depiction and FIG. 39 illustrates a stylized Y-cut cross-sectional depiction of the vFET device under manufacture of FIGS. 34-35, respectively with respect to oxide and nitride liner removal processes, in accordance with embodiments herein. The nitride 430 and the oxide 425 may be removed by any appropriate technique.

Figure 40:
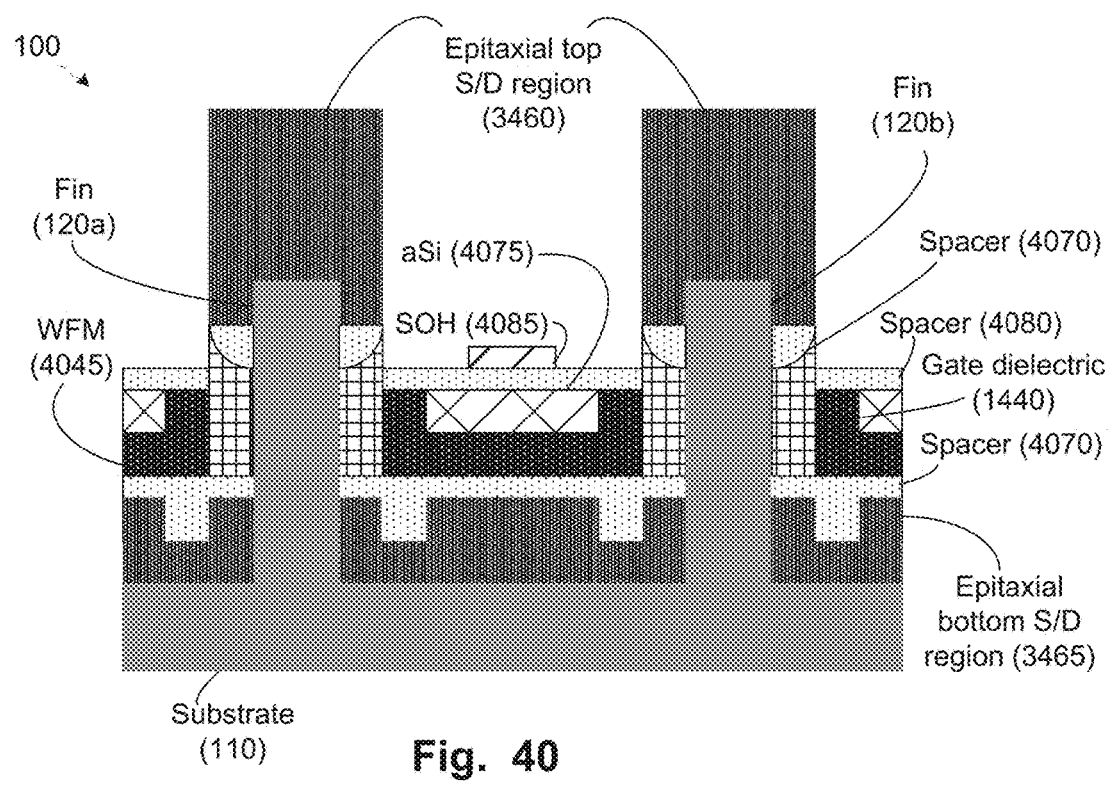
FIG. 40 illustrates a stylized X-cut cross-sectional depiction of the vFET device under manufacture with respect to gate formation processes, in accordance with embodiments herein.
Figure 41:
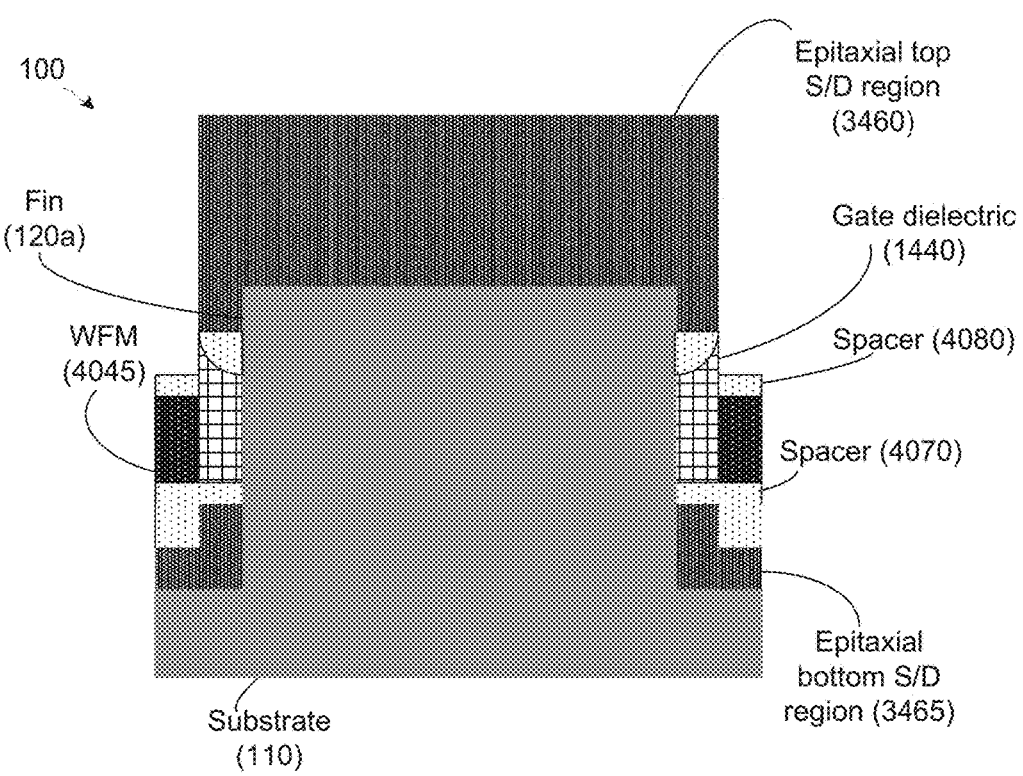
FIG. 41 illustrates a stylized Y-cut cross-sectional depiction of the vFET device under manufacture with respect to gate formation processes, in accordance with embodiments herein.

FIG. 40 illustrates a stylized X-cut cross-sectional depiction and FIG. 41 illustrates a stylized Y-cut cross-sectional depiction of the vFET device under manufacture with respect to gate formation processes, in accordance with embodiments herein. The gate formation processes followed to form the vFET device 100 of FIGS. 40-41 from the vFET device 100 of FIGS. 38-39 may involve the formation of a spacer 4070, such as a low-k spacer. The spacer 4070 may be formed over the epitaxial bottom S/D region 3465, the sidewalls of the fins 120*a* and 120*b*, and the epitaxial top S/D regions 3460. A second spacer (not shown in FIGS. 40-41) may be formed over the spacer 4070 to fill gaps between and beside fins 120a and 120b. This second spacer and portions of the spacer 4070 may then be removed, leaving the spacer 4070 as depicted in FIGS. 40-41.

A gate dielectric 1440 may then be conformally deposited over the spacer 4070, the sidewalls of the fins 120a and 120b, and the sides and tops of the epitaxial top S/D regions 3460. The gate dielectric 1440 may then be selectively recessed to remove portions disposed horizontally on the spacer 4070 and the tops of the epitaxial top S/D regions 3460. A work function metal (WFM) 4045 may then be conformally deposited over the spacer 4070, the gate dielectric 1440 on the sidewalls of the fins 120a and 120b, and the sides and tops of the epitaxial top S/D regions 3460.

Amorphous silicon (aSi) 4075 may then be deposited to fill the spaces between fins 120a and 120b. In other embodiments, amorphous carbon, polysilicon, or silicon oxide may be deposited in place of aSi 4075. The aSi 4075 (or other material) may then be recessed, such as to a height below the bottom of the spacer 4070 disposed on the bottoms of the epitaxial top S/D regions 3460. A spacer 4080 may be conformally deposited on the aSi 4075 and over the fins 120a and 120b and the epitaxial top S/D regions 3460. SOH 4085 may be deposited over the spacer 4080 and planarized, such as by chemical-mechanical polishing (CMP), to have regions between and beside the fins 120a and 120b that are coplanar with the spacer 4080 on the tops of the epitaxial top S/D regions 3460. The SOH 4085, the spacer 4080, the WFM 4045, and the gate dielectric 1440 may be recessed back to yield the vFET device 100 shown in FIGS. 40-41.

FIGS. 40-41 depict one set of gate formation processes. Other gate formation processes may involve one or more of the following.

In one embodiment, gate formation may involve forming a spacer on the bottoms of the sidewall subregions 3461 and the tops of the elevated subregions 3466 shown in FIGS. 38-39; forming a lower spacer, which may be formed from silicon nitride, on the epitaxial bottom S/D region 3465; depositing a gate dielectric and a work function metal (WFM) over the lower spacer, the fins, and the epitaxial top S/D regions 3460; forming amorphous carbon or amorphous silicon over the device up to the top of the gate dielectric and WFM on the epitaxial top S/D regions 3460; recessing the gate dielectric and the WFM from the tops and sides of the epitaxial top S/D regions 3460, to yield a recess; and forming a top spacer in the recess.

In another embodiment, gate formation may involve forming a spacer on the bottoms of the sidewall subregions 3461 and the tops of the elevated subregions 3466 shown in FIGS. 38-39; forming a lower spacer, which may be formed from silicon nitride, on the sides of the elevated subregions 3466; depositing a gate dielectric and a work function metal (WFM) over the lower spacer, the fins, and the epitaxial top S/D regions 3460; forming amorphous carbon or amorphous silicon over the device up to the top of the gate dielectric and WFM on the epitaxial top S/D regions 3460; recessing the gate dielectric and the WFM from the tops and sides of the epitaxial top S/D regions 3460, to yield a recess; and forming a top spacer in the recess.

The person of ordinary skill in the art having the benefit of the present disclosure may perform other gate formation processes as a routine matter.

The gate formation processes depicted in FIGS. 40-41 provide the gate of the vFET device 100 including the epitaxial top S/D regions 3460 and the epitaxial bottom S/D regions 3465. To complete processing of the vFET device 100, contact formation is required. Before contacts can be formed, contact scaffolding is formed.

Figure 42:
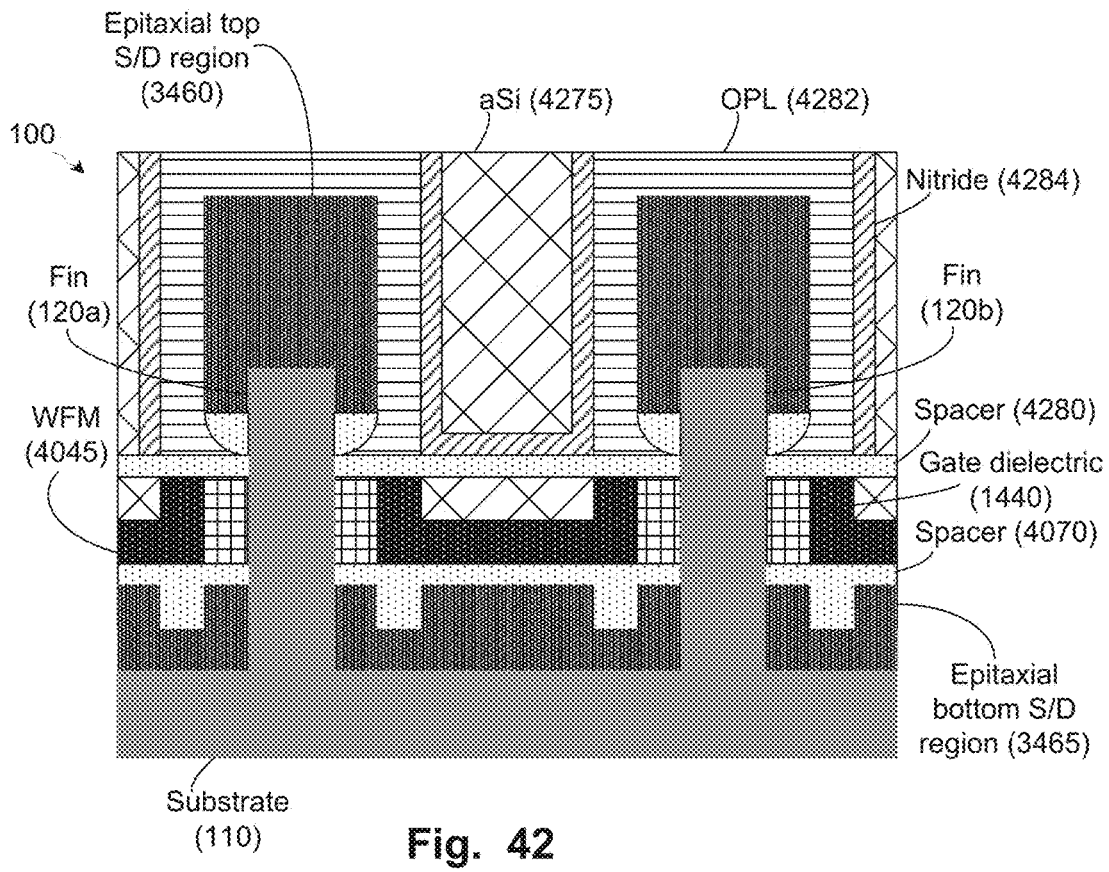
FIG. 42 illustrates a stylized X-cut cross-sectional depiction of the vFET device under manufacture with respect to spacer formation, nitride formation, amorphous silicon deposition, and spacer recession processes, in accordance with embodiments herein.
Figure 43:
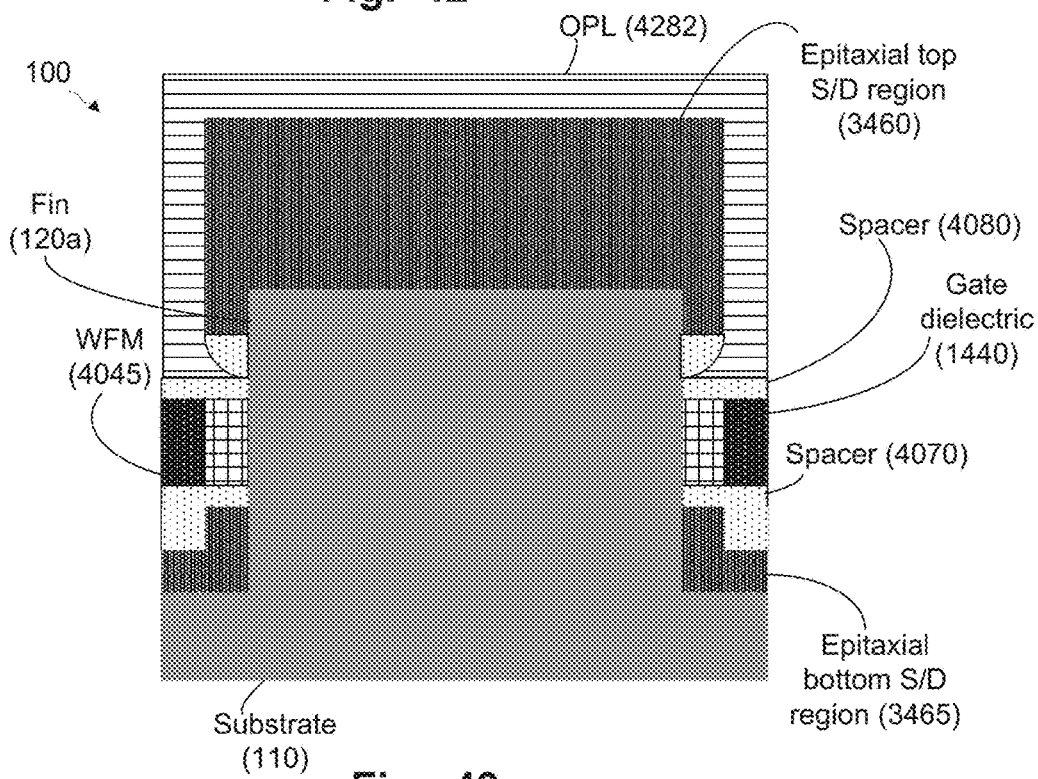
FIG. 43 illustrates a stylized Y-cut cross-sectional depiction of the vFET device under manufacture with respect to spacer formation, nitride formation, amorphous silicon deposition, and spacer recession processes, in accordance with embodiments herein.

FIG. 42 illustrates a stylized X-cut cross-sectional depiction and FIG. 43 illustrates a stylized Y-cut cross-sectional depiction of the vFET device under manufacture with respect to spacer formation, nitride formation, amorphous silicon deposition, and spacer recession processes, in accordance with embodiments herein. Starting from FIGS. 40-41, an HF or HCl etch may be performed to remove the SOH 4085 and the spacer 4080. A spacer 4080, such as a low-k spacer, may be deposited over the vFET device 100, and a nitride 4284 may be deposited over the spacer 4080. Deposition and planarization of aSi 4275 (or other materials, such as amorphous carbon, polysilicon, or silicon oxide) may then be performed to provide aSi 4275 between and beside the fins 120a and 120b. The spacer 4280 may be recessed from around the epitaxial top S/D regions 3460 and an organic polymerization layer (OPL) 4282 may be deposited in the recess around the epitaxial top S/D regions 3460.

In embodiments, an alternative material, such as a low-k spacer material, may be formed in place of the OPL 4282.

Having provided a scaffolding for contact formation, contacts may then be formed.

Figure 44:
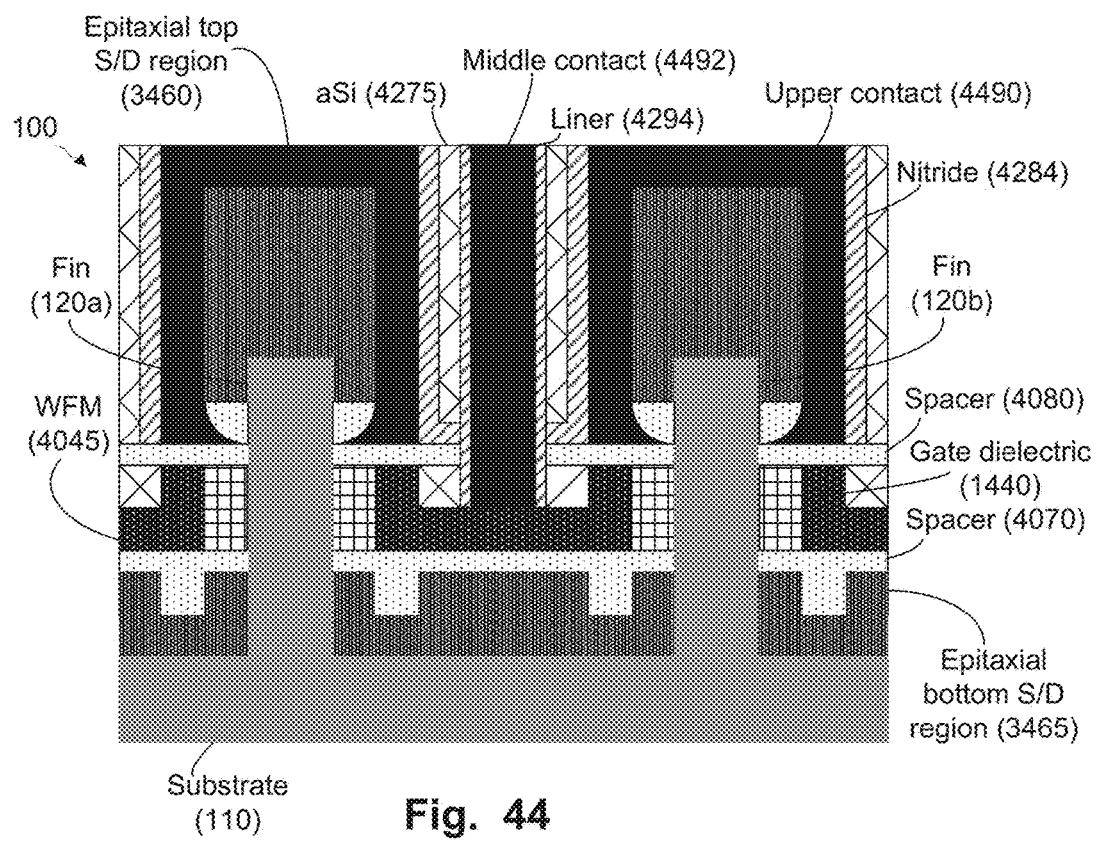
FIG. 44 illustrates a stylized X-cut cross-sectional depiction of the vFET device under manufacture with respect to contact formation processes, in accordance with embodiments herein.

FIG. 44 illustrates a stylized X-cut cross-sectional depiction of the vFET device under manufacture with respect to contact formation processes, in accordance with embodiments herein. An opening between the fins 120a and 120b to the WFM 4045 may be formed by lithography. A liner 4294, which may include silicon nitride, may be deposited over the vFET device 100, including on the sides and the bottom of the opening and a directional etch performed to remove the liner 4294 from the bottom of the opening and the horizontal surfaces of the vFET device 100. The OPL 4282 may be removed, such as by ashing, from around the epitaxial top S/D regions 3460. Alternatively, the OPL 4282 (or other material in place thereof described above) may etched to provide a contact opening to the top of the epitaxial top S/D regions 3460 while retaining OPL 4282 (or other material) along at least the sides of the epitaxial top S/D regions 3460 (not shown).

Subsequently, a fill metal may be deposited around the epitaxial top S/D regions 3460 (or in a contact opening formed to the top thereof, not shown) and in the opening lined by liner 4294. The fill metal may be tungsten, cobalt, aluminum, copper, or another metal known to the person of ordinary skill in the art. The fill metal may overfill the opening and the area around the epitaxial top S/D regions 3460, and if so, CMP may be performed to planarize the fill metal. The fill metal deposited around the epitaxial top S/D regions 3460 forms upper contacts 4490, each to one of the epitaxial top S/D regions 3460. The fill metal deposited in the opening lined by liner 4294 forms a middle contact to WFM 4045, i.e., a contact to the gate of each vFET device 100.

Figure 45:
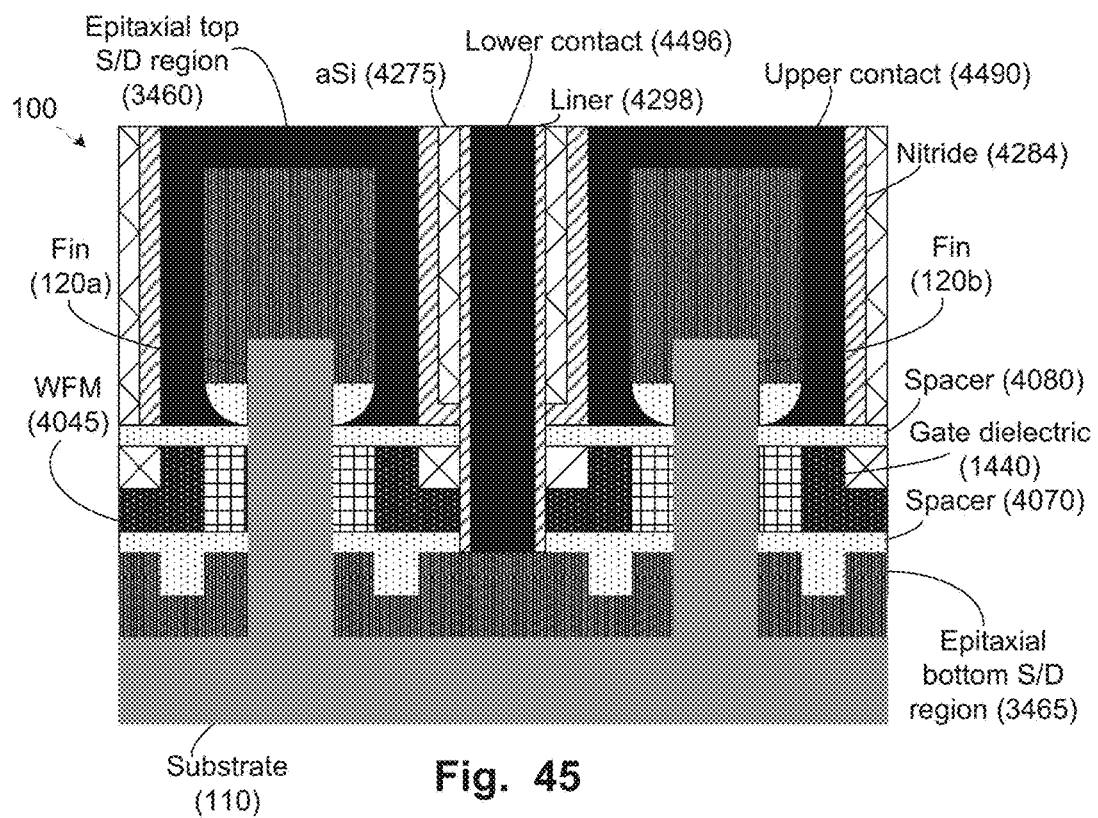
FIG. 45 illustrates a stylized X-cut cross-sectional depiction of the vFET device under manufacture with respect to contact formation processes, in accordance with embodiments herein.

FIG. 45 illustrates a stylized X-cut cross-sectional depiction of the vFET device under manufacture of FIG. 42 with respect to additional contact formation processes, in accordance with embodiments herein. FIG. 45 resembles FIG. 44, except in that the lined opening formed between two fins 120 is to the epitaxial bottom S/D region 3465. Upon filling of the opening, a lower contact 4496 is formed to the epitaxial bottom S/D region 3465.

In embodiments wherein the vFET device 100 contains three or more fins 120, the middle contact 4492 may be formed between first and second fins 120, and the lower contact 4496 may be formed between second and third fins 120.

Figure 46:
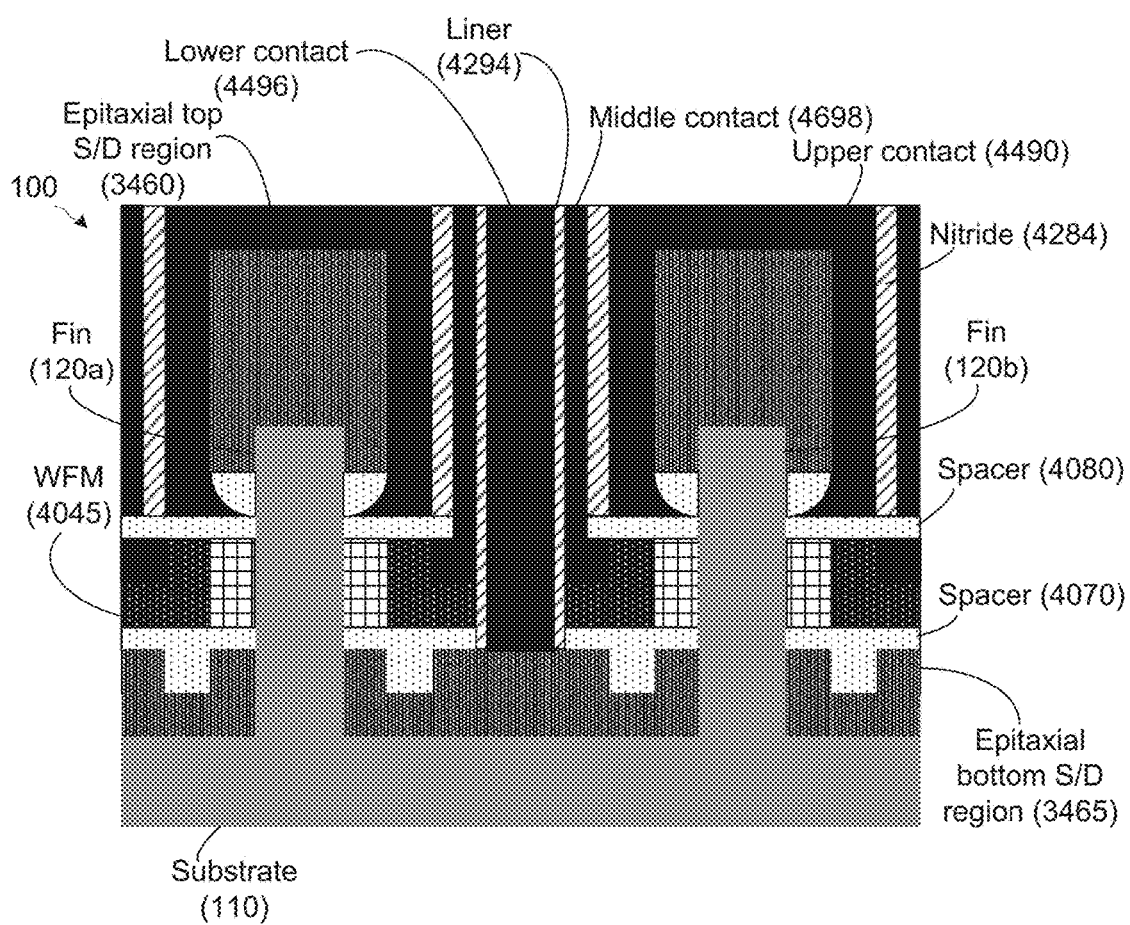
FIG. 46 illustrates a stylized X-cut cross-sectional depiction of the vFET device under manufacture with respect to contact formation processes, in accordance with embodiments herein.

FIG. 46 illustrates a stylized X-cut cross-sectional depiction of the vFET device under manufacture of FIG. 42 with respect to other contact formation processes, in accordance with embodiments herein. An opening between the fins 120*a* and 120*b* to the epitaxial bottom S/D region 3465 may be formed by lithography. A liner 4294, which may include silicon nitride, may be formed as described above with reference to FIG. 44. In this embodiment, the opening between the fins 120*a* and 120*b* may be filled with the OPL 4282. Materials disposed between the fins 120*a* and 120*b* may be removed, leaving an OPL pillar lined by liner 4294 and open spaces between the liner 4294 and the nitride 4284.

The open spaces expose the WFM 4045. Accordingly, a middle contact 4698 may be formed by depositing a fill metal in the open spaces, as depicted in FIG. 46. In one embodiment, the fill metal may be tungsten. Thereafter, the OPL 4282 surrounding the epitaxial top S/D regions 3460 and the OPL 4282 in the pillar between the fins 120*a* and 120*b* is removed, such as by ashing. The fill metal is deposited around the epitaxial top S/D regions 3460, to form upper contact 4490, and in the pillar lined by liner 4294 between the fins 120*a* and 120*b*, to form lower contact 4496. Forming the contacts may involve overfilling and CMP.

Figure 47:
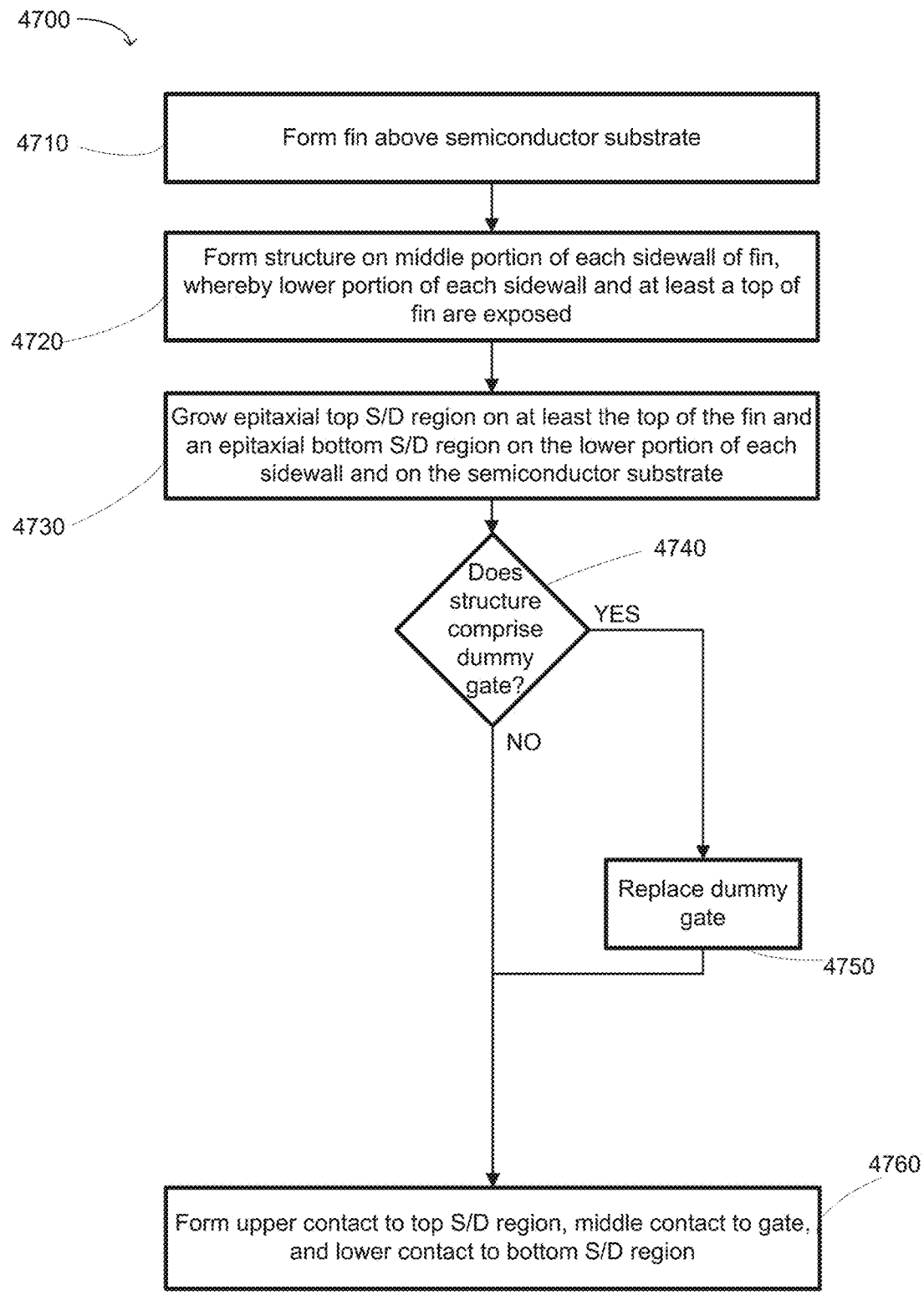
FIG. 47 illustrates a flowchart depiction of process steps of providing a vFET device, in accordance with embodiments herein.

Turning now to FIG. 47, a flowchart depiction of process steps of providing a vFET device in accordance with embodiments herein is illustrated. The process 4700 may include forming (at 4710) a fin above a semiconductor substrate. The process 4700 may also include forming (at 4720) a structure on a middle portion of each sidewall of the fin, whereby a lower portion of each sidewall of the fin adjacent the semiconductor substrate and at least a top of the fin are uncovered by the structure. In one embodiment, an upper portion of each sidewall of the fin adjacent the top of the fin is exposed after forming the structure.

In one embodiment, the structure includes a gate. In another embodiment, the structure contains a dummy gate.

The process 4700 may additionally involve growing (at 4730) an epitaxial top source/drain (S/D) region on at least the top of the fin, and an epitaxial bottom S/D region on the lower portion of each sidewall of the fin and on the semiconductor substrate. In one embodiment, at least a portion of each side of at least the top S/D region is bounded by the structure.

The process 4700 may vary depending on whether the structure includes a dummy gate, as represented by decision diamond 4740. If the structure includes a dummy gate, the process 4700 may further include replacing (at 4750) the dummy gate with a gate.

Regardless whether the structure contained a dummy gate when flow enters decision diamond 4740, the process may further involve forming (at 4760) an upper contact to the top S/D region, a middle contact to the gate, and a lower contact to the bottom S/D region.

Figure 48:
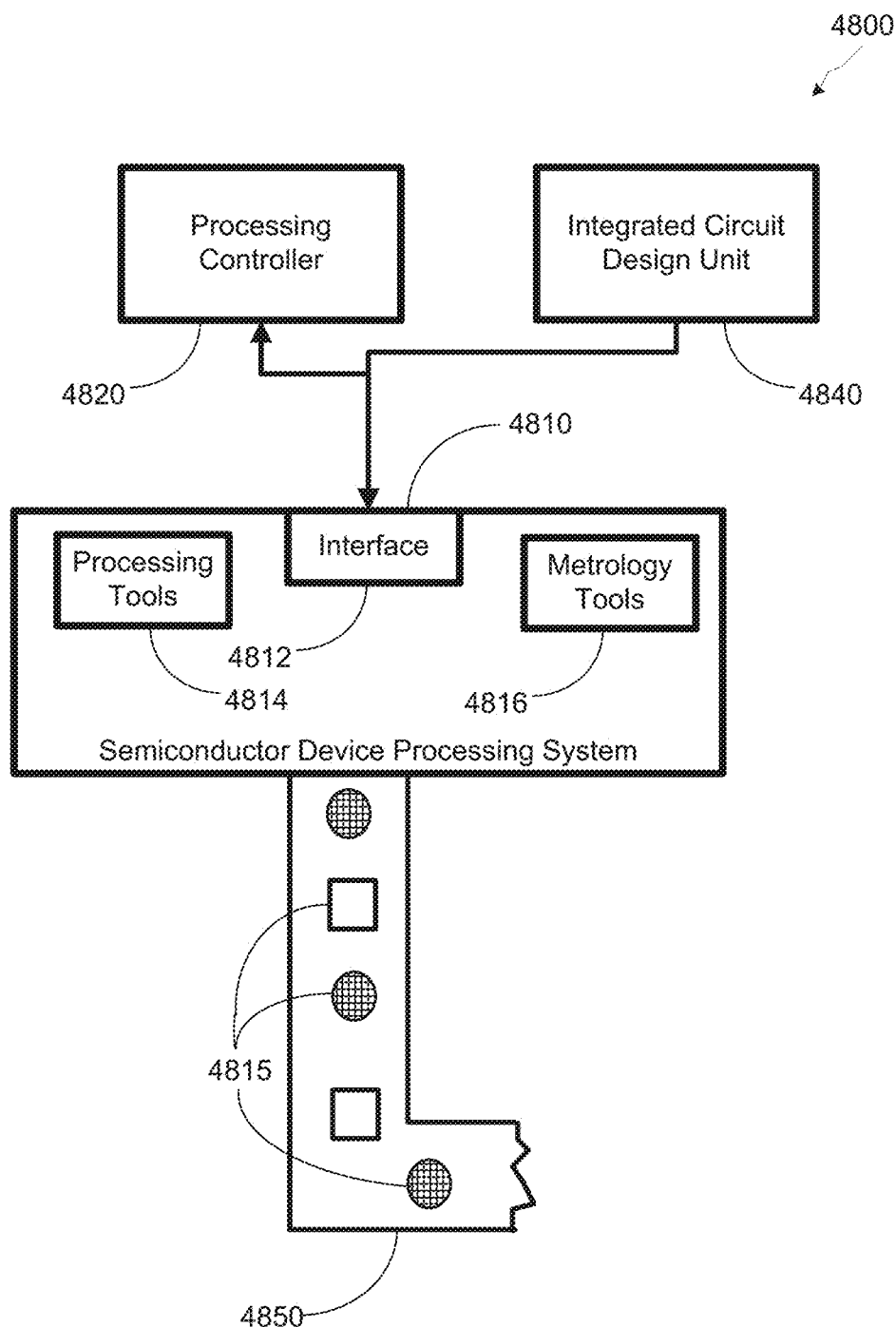
FIG. 48 illustrates a stylized depiction of a system for fabricating a semiconductor device package including a vFET device, in accordance with embodiments herein.

Turning now to FIG. 48, a stylized depiction of a system 4800 for fabricating a semiconductor device package including a vFET, in accordance with embodiments herein, is illustrated. A system 4800 of FIG. 48 may include a semiconductor device processing system 4810 and a design unit 4840. The semiconductor device processing system 4810 may manufacture integrated circuit devices based upon one or more designs provided by the design unit 4840. The system 4800 may be capable of performing at least one of the process steps described in FIGS. 2-46. The semiconductor device processing system 4810 may be capable of implementing at least one step of the process 4700 described in the flowchart of FIG. 47.

The semiconductor device processing system 4810 may include various processing stations, such as etch process stations, photolithography process stations, CMP process stations, etc. Each of the processing stations may include one or more processing tools 4814 and or metrology tools 4816. Feedback based on data from the metrology tools 4816 may be used to modify one or more process parameters used by the processing tools 4814 for performing process steps.

The semiconductor device processing system 4810 may also include an interface 4812 that is capable of providing communications between the processing tools 4814, the metrology tools 4816, and a controller, such as the processing controller 4820. One or more of the processing steps performed by the semiconductor device processing system 4810 may be controlled by the processing controller 4820. The processing controller 4820 may be a workstation computer, a desktop computer, a laptop computer, a tablet computer, or any other type of computing device including one or more software products that are capable of controlling processes, receiving process feedback, receiving test results data, performing learning cycle adjustments, performing process adjustments, etc.

The semiconductor device processing system 4810 may produce integrated circuits (e.g., vFET devices) on a medium, such as silicon wafers. In one embodiment, the semiconductor device processing system 4810 may produce integrated circuits having vFET devices 100 containing a semiconductor substrate, a fin above the semiconductor substrate; a structure on a middle portion of each sidewall of the fin; wherein a lower portion of each sidewall of the fin adjacent the semiconductor substrate and at least a top of the fin are uncovered by the structure; a top source/drain (S/D) region on at least the top of the fin; and a bottom S/D region on the lower portion of the fin and the semiconductor substrate. In one embodiment, the top S/D region may also be disposed on an upper portion of each sidewall of the fin. Alternatively or in addition, at least a portion of each side of at least the top S/D region is bounded by the structure. In one embodiment, the bottom S/D region may further contain an elevated subregion on the lower portion of each sidewall of each fin, wherein the elevated subregion is vertically aligned with the top S/D region. The structure may include a gate or a dummy gate. If the structure includes a gate, in one embodiment, the semiconductor device may further include an upper contact to the top S/D region, a middle contact to the gate, and a lower contact to the bottom S/D region.

The production of integrated circuits by the semiconductor device processing system 4810 may be based upon the circuit designs provided by the integrated circuits design unit 4840. The semiconductor device processing system 4810 may provide processed integrated circuits/devices 4815 on a transport mechanism 4850, such as a conveyor system. In some embodiments, the conveyor system may be sophisticated clean room transport systems that are capable of transporting semiconductor wafers. In one embodiment, the semiconductor device processing system 4810 may include a plurality of processing steps, e.g., the $1^{st}$ process step, the $2^{nd}$ process step, etc., as described above.

In some embodiments, the items labeled "4815" may represent individual wafers, and in other embodiments, the items 4815 may represent a group of semiconductor wafers, e.g., a "lot" of semiconductor wafers. The integrated circuit or device 4815 may be a transistor, a capacitor, a resistor, a memory cell, a processor, and/or the like.

The integrated circuit design unit 4840 of the system 4800 is capable of providing a circuit design that may be manufactured by the semiconductor device processing system 4810. This may include information regarding the components of the vFET device 100 described above.

The system 4800 may be capable of performing analysis and manufacturing of various products involving various technologies. For example, the system 4800 may receive design and production data for manufacturing devices of CMOS technology, Flash technology, BiCMOS technology, power devices, memory devices (e.g., DRAM devices), NAND memory devices, and/or various other semiconductor technologies. This data may be used by the system 4800 to fabricate the devices 300 described herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a fin above a semiconductor substrate;
    forming a structure on a middle portion of each sidewall of the fin, whereby a lower portion of each sidewall of the fin adjacent the semiconductor substrate and at least a top of the fin are uncovered by the structure; and
    forming a first epitaxial region on at least the top of the fin for forming a top source/drain (S/D) region, and a second epitaxial region on the lower portion of each sidewall and on the semiconductor substrate for forming a bottom S/D region, such that the bottom S/D region comprises an elevated subregion on the lower portion of each sidewall of each fin, wherein the elevated subregion is vertically aligned with the top S/D region.

2. The method of claim 1, wherein, after forming the structure, an upper portion of each sidewall of the fin adjacent the top of the fin is exposed.

3. The method of claim 1, wherein at least a portion of each side of at least the top S/D region is bounded by the structure.

4. The method of claim 1, wherein forming the structure comprises forming a gate.

5. The method of claim 4, further comprising:
    forming an upper contact to the top S/D region, a middle contact to the gate, and a lower contact to the bottom S/D region.

6. The method of claim 1, wherein the forming structure comprises forming a dummy gate.

7. The method of claim 6, further comprising:
    replacing the dummy gate with a gate.

8. The method of claim 7, further comprising:
    forming an upper contact to the top S/D region, a middle contact to the gate, and a lower contact to the bottom S/D region.

9. A semiconductor device, comprising:
    a semiconductor substrate,
    a fin above the semiconductor substrate;
    a structure on a middle portion of each sidewall of the fin;
        wherein a lower portion of each sidewall of the fin adjacent the semiconductor substrate and at least a top of the fin are uncovered by the structure;
    a top source/drain (S/D) region on at least the top of the fin; and
    a bottom S/D region on the lower portion of the fin and the semiconductor substrate, wherein the bottom S/D region further comprises an elevated subregion on the lower portion of each sidewall of each fin, wherein the elevated subregion is vertically aligned with the top S/D region.

10. The semiconductor device of claim 9, wherein the top S/D region is also disposed on an upper portion of each sidewall of the fin.

11. The semiconductor device of claim 9, wherein at least a portion of each side of at least the top S/D region is bounded by the structure.

12. The semiconductor device of claim 9, wherein the structure comprises a gate.

13. The semiconductor device of claim 12, further comprising:
    an upper contact to the top S/D region, a middle contact to the gate, and a lower contact to the bottom S/D region.

14. The semiconductor device of claim 9, wherein the structure comprises a dummy gate.

15. A system, comprising:
    a semiconductor device processing system to manufacture a semiconductor device; and
    a processing controller operatively coupled to said semiconductor device processing system, said processing controller configured to control an operation of the semiconductor device processing system;
    wherein the semiconductor device processing system is adapted to:
    form a fin above a semiconductor substrate;
    form a structure on a middle portion of each sidewall of the fin, whereby a lower portion of each sidewall of the fin adjacent the semiconductor substrate and at least a top of the fin are uncovered by the structure; and
    form a first epitaxial region on at least the top of the fin for forming a top source/drain (S/D) region, and a second epitaxial region on the lower portion of each sidewall of the fin and on the semiconductor substrate for forming a bottom S/D region, such that the bottom S/D region comprises an elevated subregion on the lower portion of each sidewall of each fin, wherein the elevated subregion is vertically aligned with the top S/D region.

16. The system of claim 15, wherein the semiconductor device processing system is adapted to form the structure by forming a gate.

17. The system of claim 16, wherein the semiconductor device processing system is further adapted to:
    form an upper contact to the top S/D region, a middle contact to the gate, and a lower contact to the bottom S/D region.

18. The system of claim 15, wherein the semiconductor device processing system is adapted to form the structure by forming a dummy gate.

19. The system of claim 18, wherein the semiconductor device processing system is further adapted to:
    replace the dummy gate with a gate.

* * * * *